US008010853B2

(12) United States Patent
Kato

(10) Patent No.: US 8,010,853 B2
(45) Date of Patent: Aug. 30, 2011

(54) SEMICONDUCTOR STORAGE DEVICE AND MEMORY TEST CIRCUIT

(75) Inventor: Takayuki Kato, Kasugai (JP)

(73) Assignee: Fujitsu Semiconductor Ltd., Yokohama (JP)

( * ) Notice: Subject to any disclaimer, the term of this patent is extended or adjusted under 35 U.S.C. 154(b) by 155 days.

(21) Appl. No.: 11/275,923

(22) Filed: Feb. 3, 2006

(65) Prior Publication Data

US 2007/0089005 A1    Apr. 19, 2007

(30) Foreign Application Priority Data

Sep. 30, 2005  (JP) ................................. 2005-289044

(51) Int. Cl.
   *G11C 29/00*   (2006.01)
   *G01R 31/28*   (2006.01)
(52) U.S. Cl. .................. 714/719; 714/723; 714/736
(58) Field of Classification Search .................. 714/736, 714/733
   See application file for complete search history.

(56) References Cited

U.S. PATENT DOCUMENTS

| | | | |
|---|---|---|---|
| 6,163,491 A | 12/2000 | Iwamoto et al. | |
| 6,252,805 B1 * | 6/2001 | So et al. .................. | 365/189.07 |
| 6,275,428 B1 * | 8/2001 | Fukuda et al. ................. | 365/201 |
| 6,275,963 B1 * | 8/2001 | Maeno et al. ................. | 714/726 |
| 2001/0000449 A1 * | 4/2001 | Satoh ............................. | 365/120 |
| 2001/0005014 A1 * | 6/2001 | Koshikawa ........................ | 257/1 |
| 2002/0141259 A1 | 10/2002 | Mak et al. | |
| 2005/0015690 A1 | 1/2005 | Motomochi | |
| 2005/0207245 A1 | 9/2005 | Kang | |
| 2005/0278595 A1 * | 12/2005 | Anzou ............................ | 714/733 |
| 2007/0011535 A1 * | 1/2007 | Anzou et al. ................... | 714/733 |

FOREIGN PATENT DOCUMENTS

| | | |
|---|---|---|
| JP | 3-16080 | 2/1991 |
| JP | 6-259994 | 9/1994 |
| JP | 8-262116 | 10/1996 |
| JP | 11-86593 | 3/1999 |
| JP | 2974313 | 9/1999 |
| JP | 2000-48599 | 2/2000 |
| JP | 2000-111618 | 4/2000 |
| JP | 3193622 | 5/2001 |
| JP | 2002-163899 | 6/2002 |
| JP | 2003-346498 | 12/2003 |
| JP | 2004-144717 | 5/2004 |
| JP | 2004-219310 | 8/2004 |
| JP | 2004-530243 | 9/2004 |
| JP | 2005-38511 | 2/2005 |
| JP | 2005-276423 | 10/2005 |
| JP | 2006-114192 | 4/2006 |
| WO | 02/080183 A2 | 10/2002 |
| WO | 02/080183 A3 | 10/2002 |

OTHER PUBLICATIONS

Notice of Rejection Grounds for corresponding Japanese patent application No. 2005-289044, mailed Apr. 12, 2011.

* cited by examiner

*Primary Examiner* — Jeffrey A Gaffin
*Assistant Examiner* — Daniel McMahon
(74) *Attorney, Agent, or Firm* — Staas & Halsey LLP

(57) ABSTRACT

Each of a plurality of nonmatching detection circuits is provided for each bit, compares bit output of memory with an expected value corresponding to the bit output, and outputs a nonmatching detection signal when the bit output does not match the value. A selection circuit selects and outputs the output of one or more nonmatching detection circuits in the plurality of nonmatching detection circuits. When the selection circuit outputs at least one nonmatching detection signal, a nonmatching result holding circuit holds the value of the nonmatching detection signal.

10 Claims, 28 Drawing Sheets

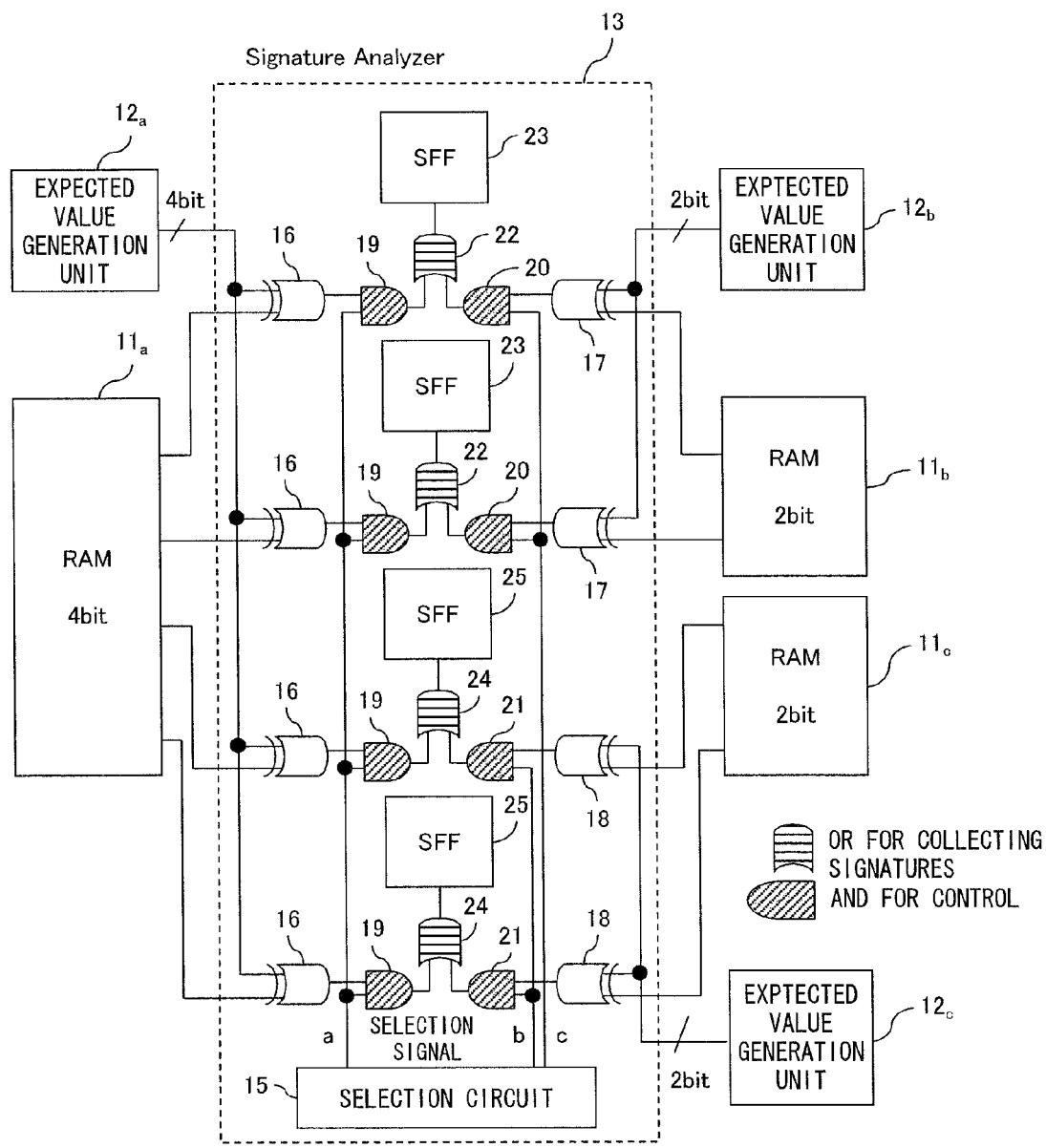
F I G. 3

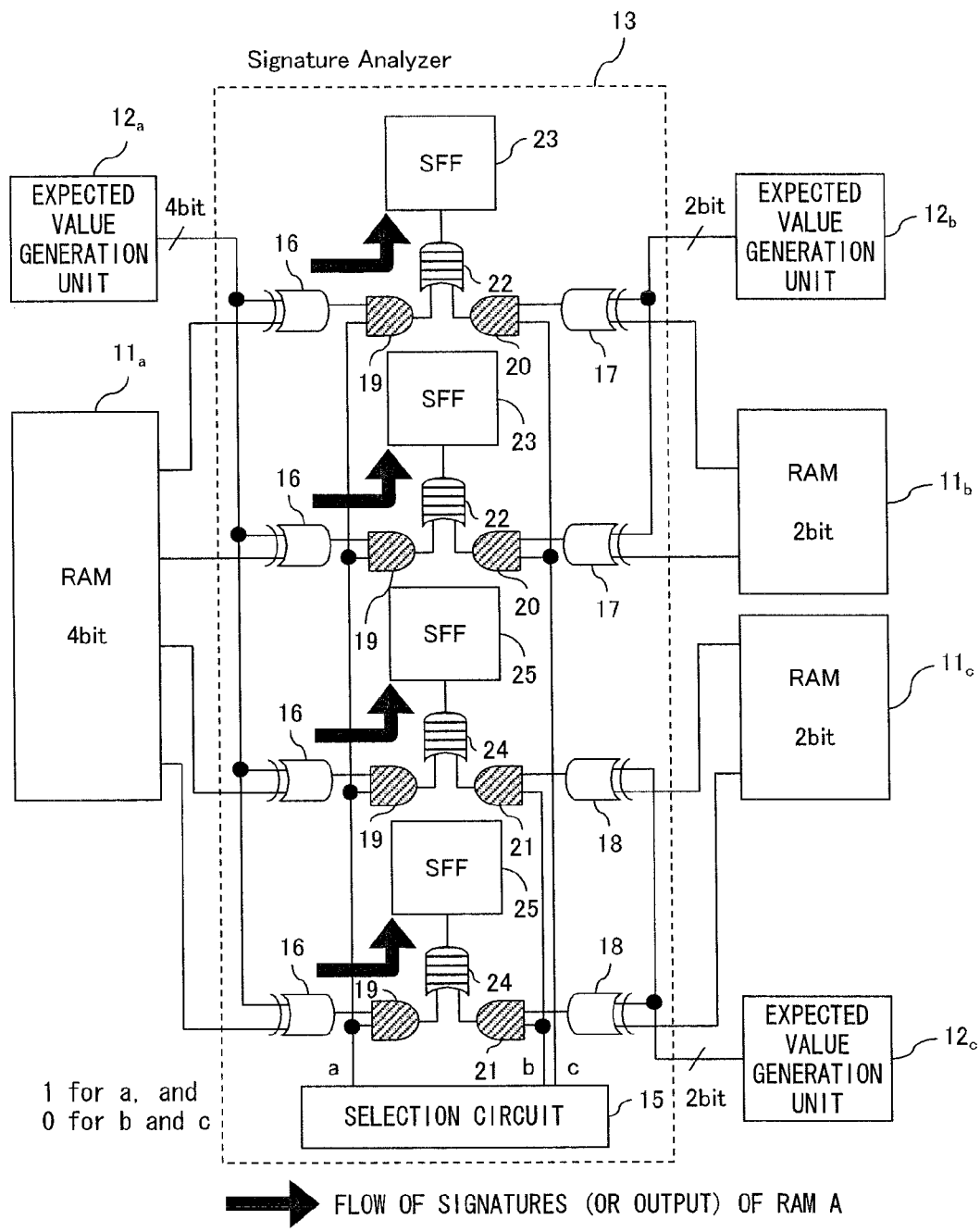
F I G. 5 A

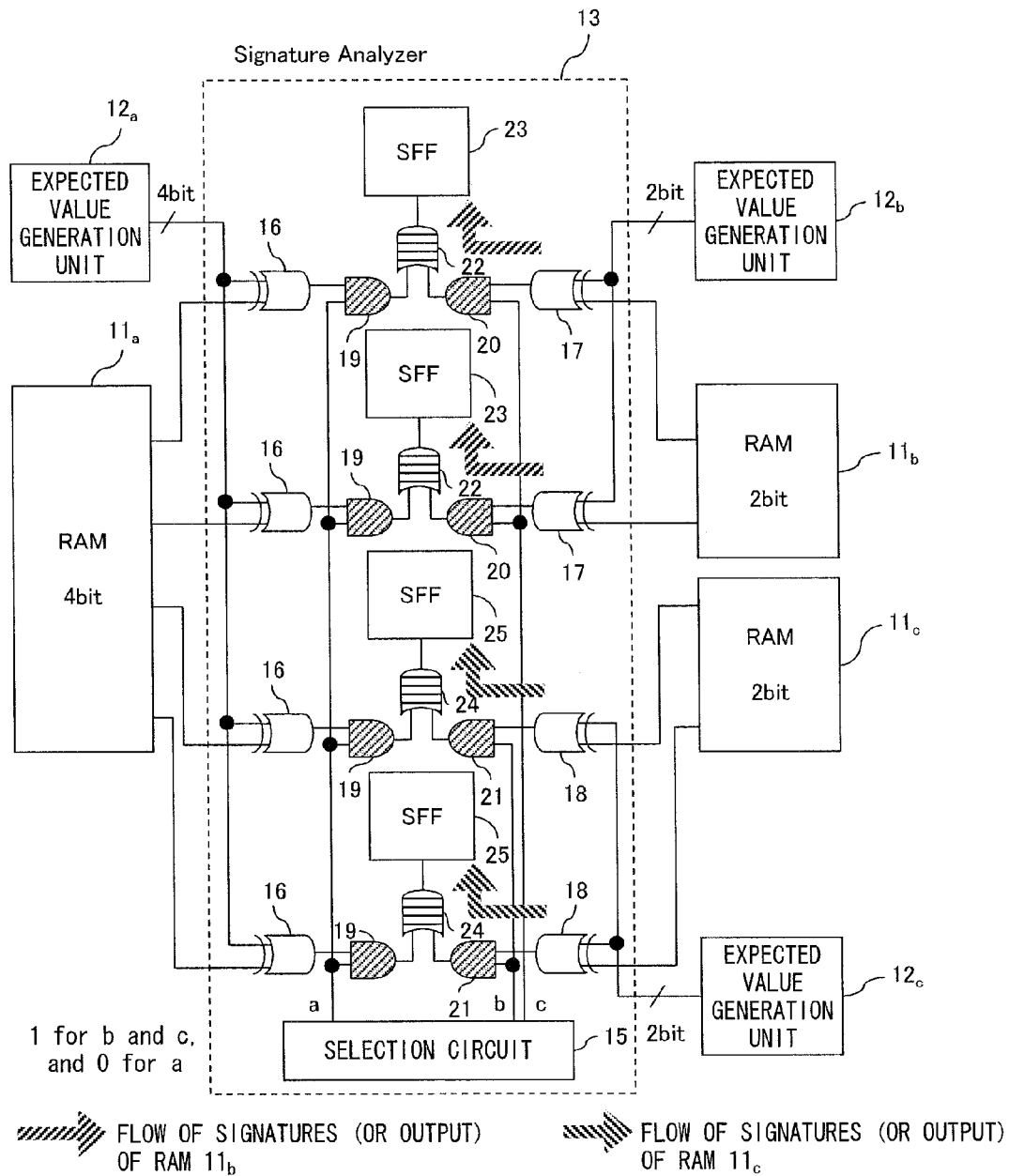
F I G. 5B

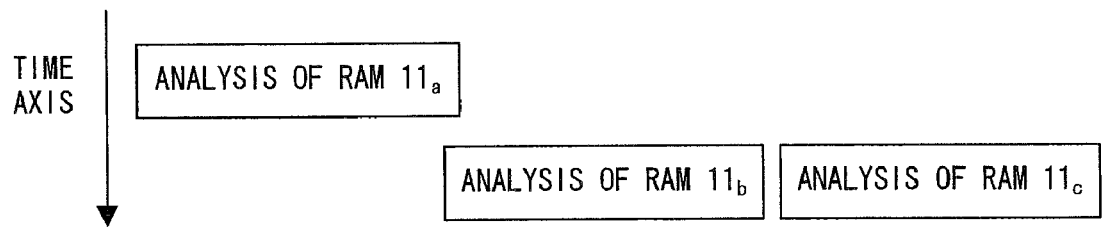
F I G. 6

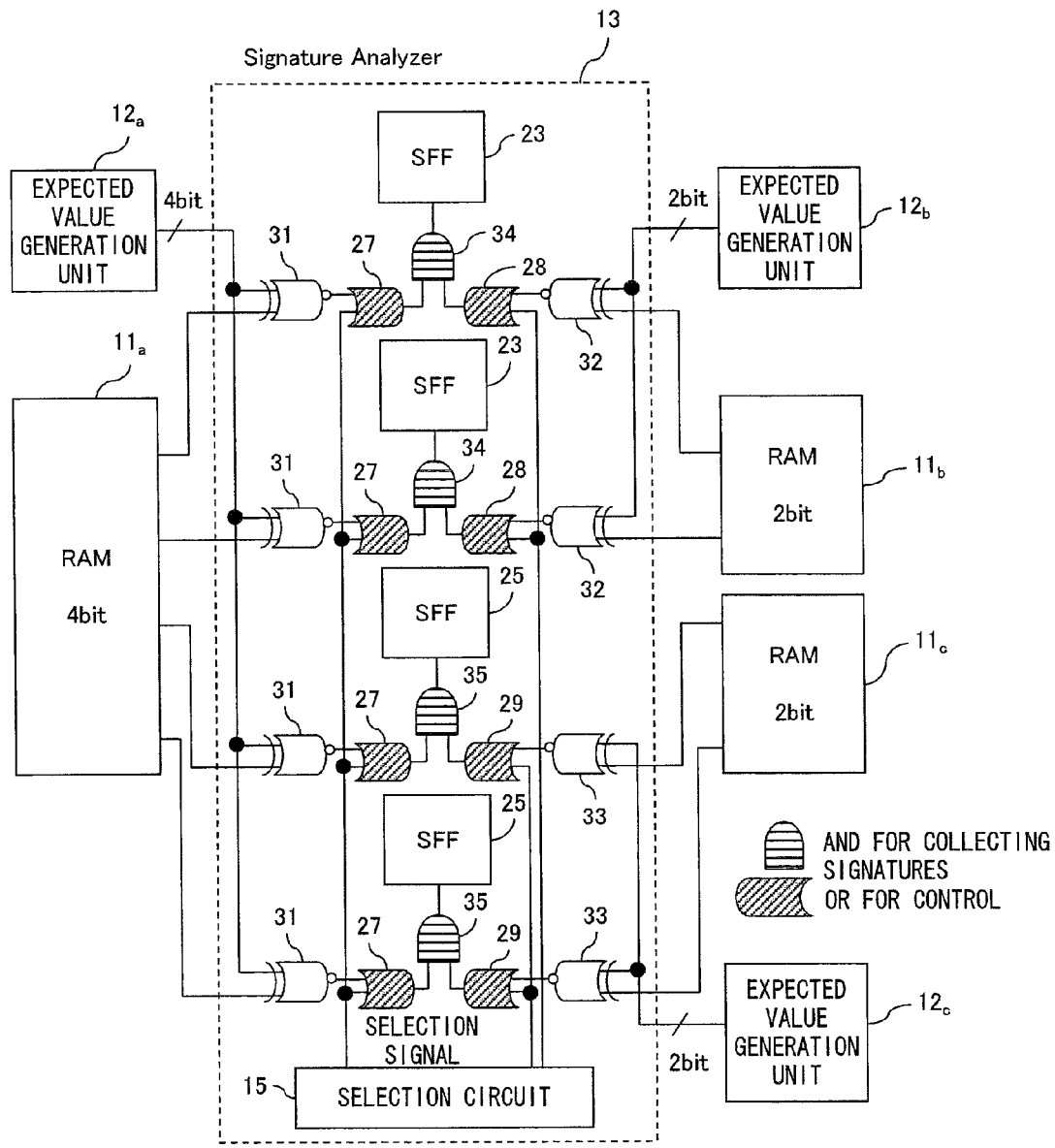
F I G. 7

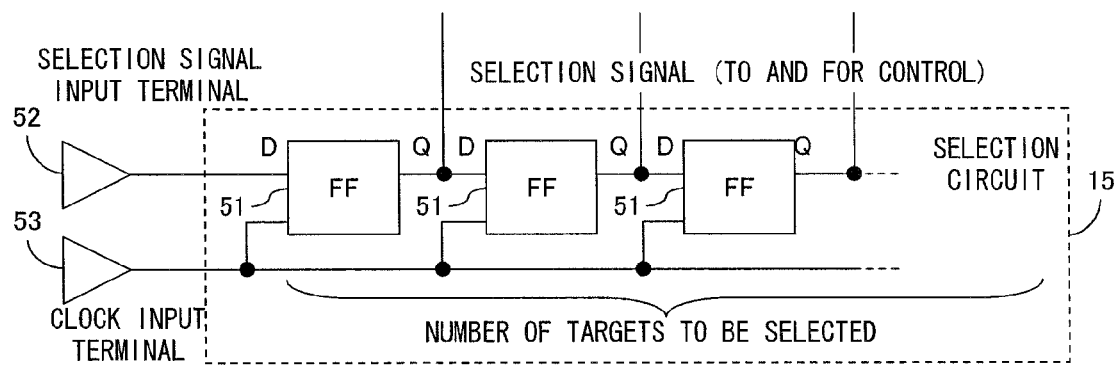
F I G. 10

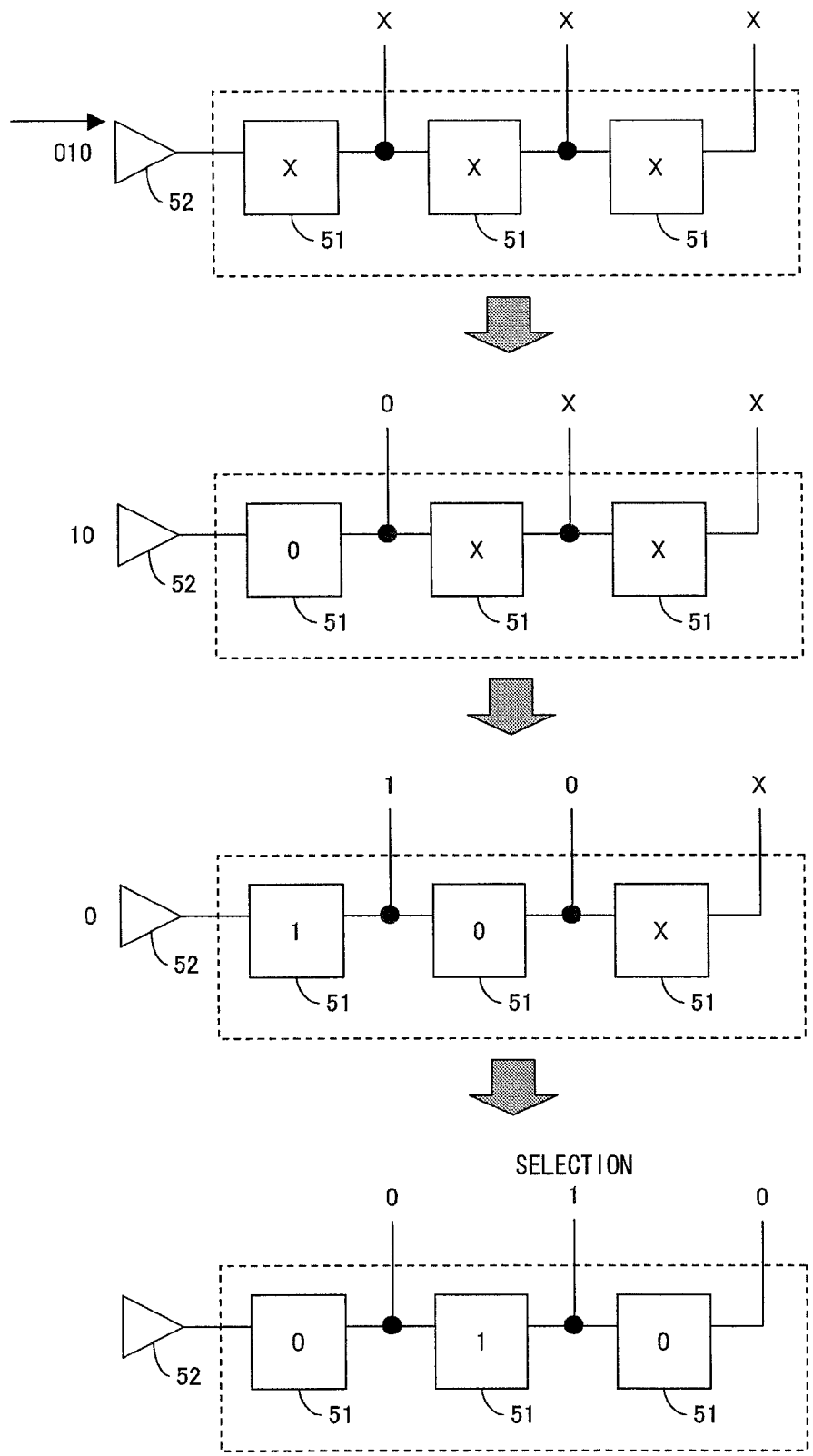
F I G. 1 2

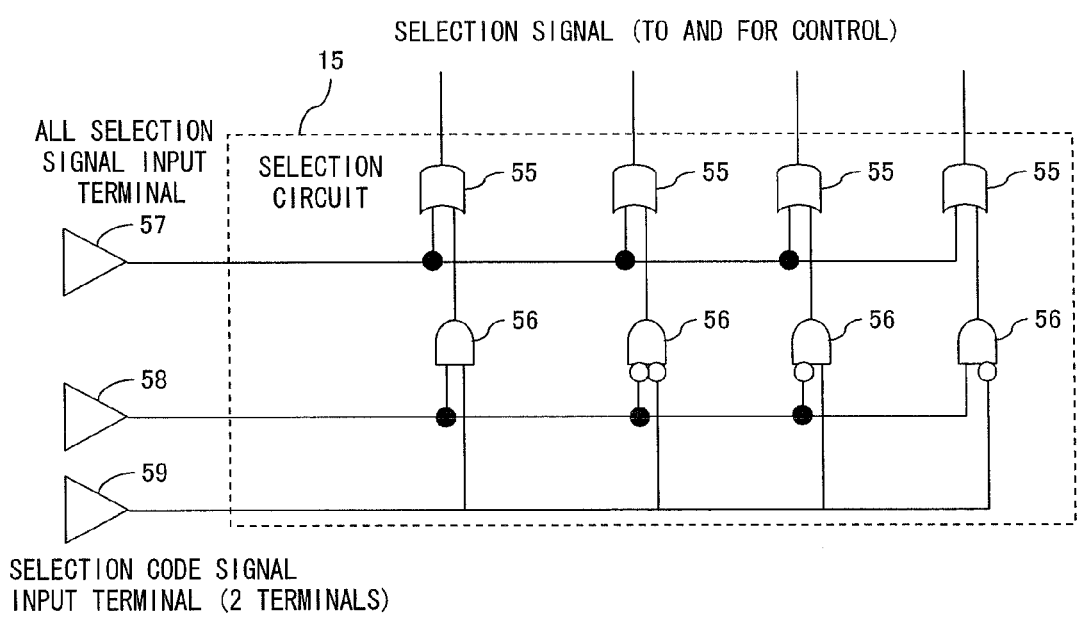
F I G. 1 3

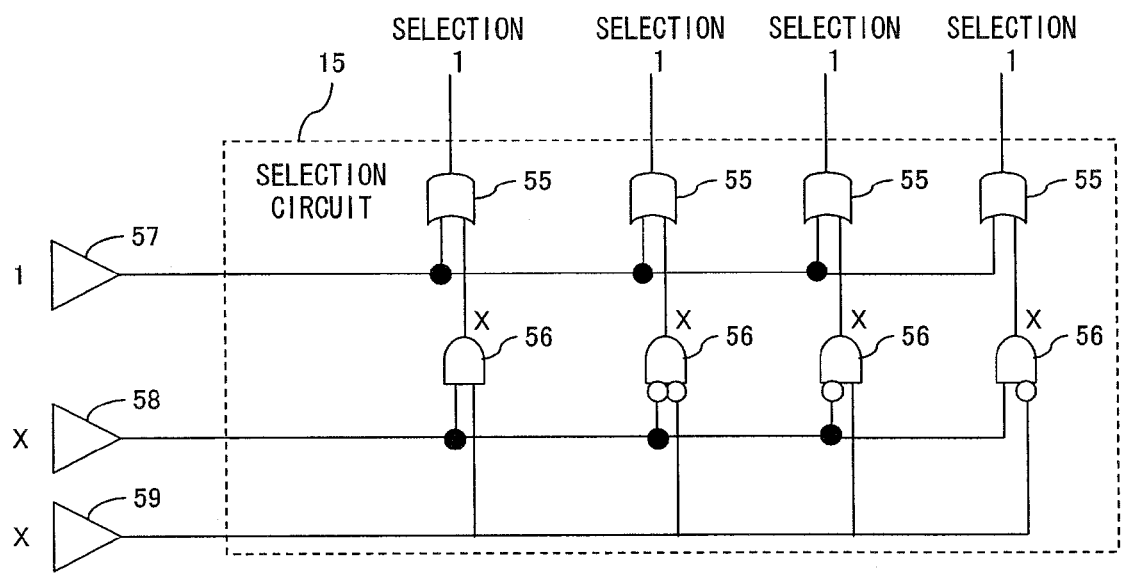
F I G. 1 4

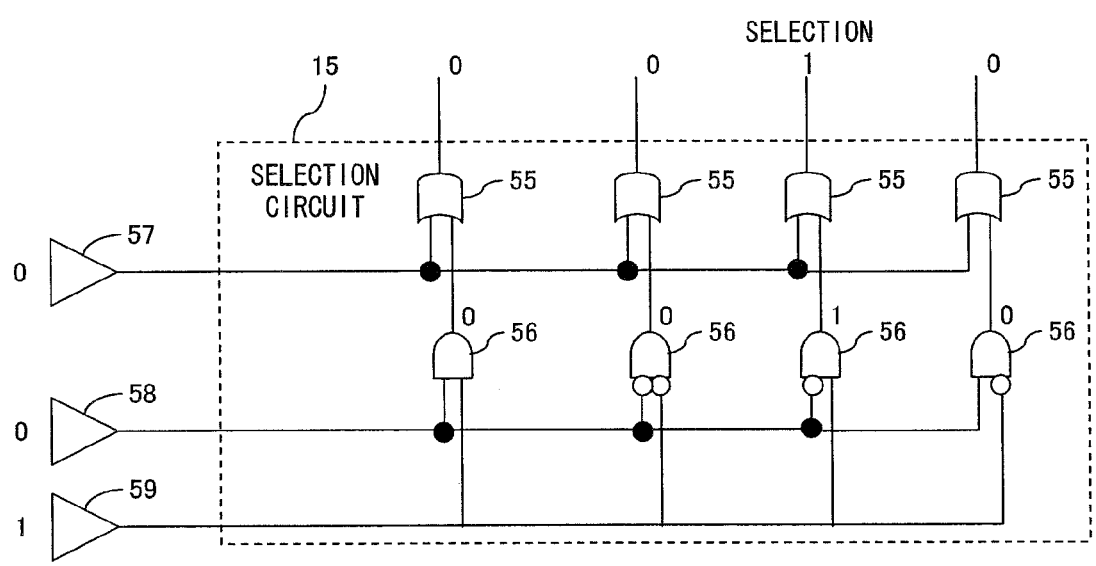
F I G. 1 5

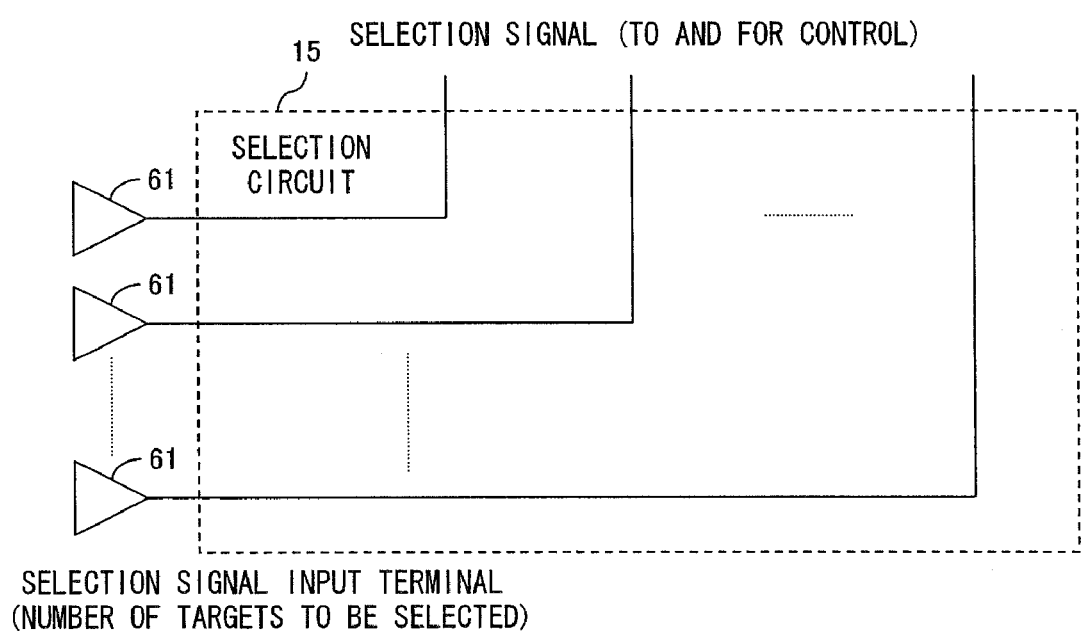
F I G. 1 6

|  | PRESENT INVENTION | FIRST CONVENTIONAL TECHNOLOGY | SECOND AND THIRD CONVENTIONAL TECHNOLOGY | FOURTH AND FIFTH CONVENTIONAL TECHNOLOGY |
|---|---|---|---|---|
| AREA OVERHEAD | ○ | × | ○ | ○ |
| TEST COST | ○ | ○ | ○ | × |
| DEFECT ANALYSIS | ○ | ○ | × | ○ |

FIG. 20

SEMICONDUCTOR STORAGE DEVICE AND MEMORY TEST CIRCUIT

CROSS REFERENCE TO RELATED APPLICATIONS

This application is based upon and claims the benefit of priority from the prior Japanese Patent Application No. 2005-289044, filed Sep. 30, 2005, the entire contents of which are incorporated herein by this reference.

BACKGROUND OF THE INVENTION

1. Field of the Invention

The present invention relates to a test method for a storage device, and more specifically to, for example, a memory test circuit capable of reducing the number of scan flip-flop for fetching a test result, as a memory test circuit incorporated into the inside of a chip like a BIST circuit for RAM, thereby reducing the area of the test circuit.

2. Description of the Related Art

Recently, with an increasing number of loaded memory units into an LSI chip and a larger capacity of memory itself, a memory testing time increases, and a test cost has soared.

Therefore, a test method referred to as a "built-in self-test (BIST)" in which a test pattern is generated in the LSI chip is often used in a test of memory such as random access memory (RAM). Using the BIST, the time taken by inputting/outputting test data between an LSI tester and an LSI chip can be reduced, thereby shortening the testing time.

FIG. 1A shows the configuration of the memory test circuit in the BIST method according to the first conventional technology. FIG. 1A only shows the test circuit on the output side of the memory. Practically, there also is a test pattern generation circuit for generating an input test pattern for the memory on the memory input side, In FIG. 1A, for three RAM 100a, 100b, and 100c, there are signature analyzers 102a, 102b, and 102c for receiving the respective output of expected value generation units 101a, 101b, and 101c for generating an expected value for each bit output, together with the output of the above-mentioned RAM.

In the conventional technology, for example, each output of four bits of the RAM 100a is input to the four EXOR gates in the signature analyzer 102a together with the expected value of each bit output by the expected value generation unit 101a, and an exclusive logical sum of two inputs is obtained. If the output of the RAM and the expected value match each other, then "0" is output. If they do not match, then "1" is output from each EXOR gate. The output of each EXOR gate is input to the scan flip-flop (SFF), and the value of the signature of the RAM as output of each EXOR gate is fetched to each SFF and stored there. The scan flip-flop is obtained by adding the functions of a scan shift to a common flip-flop, but the configuration itself of the SFF is not directly related to the present invention, and the detailed explanation of the configuration is omitted here.

In the first conventional technology, the SFF holding the value of the signature is required for each of the four bits of the RAM 100a, the two bits of the RAM 100b, and the two bits of the RAM 100c. In this example, a total of eight SFFs are used.

FIG. 1B is a time chart of the shipment test of the RAM according to the first conventional technology. In the first conventional technology, since an SFF is provided for each bit of the three RAM 100a, 100b, and 100c, the shipment test can be simultaneously performed on the three RAM units.

Since the SFF is provided for each bit of the RAM as described above in the first conventional technology shown in FIG. 1A, there are advantages that all tests on the RAM can be simultaneously performed at the shipment test and in the defect analysis for determining the fault of a bit of any RAM, and a necessary test cost is low. However, it also has the disadvantage that since a number of SFFs having large areas as compared with other cells are used, the overhead of the areas is large.

To reduce the overhead of the areas, there are some methods of sharing an SFF in the conventional technologies. FIG. 1C shows the configuration of the circuit according to the second conventional technology, and FIG. 1D shows the configuration of the circuit according to the third conventional technology. In the second conventional technology shown in FIG. 1C, the value of the signature corresponding to the output of each RAM is collected by the OR gate, and provided for one SFF.

In the third embodiment shown in FIG. 1D, the signature for the output of each bit of a plurality of RAM is collected by one OR gate, and input to one SFF. In these second and third conventional technologies, the value of the signature as a nonmatching detection signal indicating a result of non-matching with the expected value is "1", and it is determined that although the OR gate collects the value, any RAM or any bit is defective. Relating to sharing an SFF using the above-mentioned OR gate, a similar circuit is disclosed by the patent documents 1 through 3.

[Patent Document 1] Japanese Patent Application Publication No. 2002-163899 "Semiconductor Storage Device"

[Patent Document 2] Japanese Patent Publication No. 2974313 "BIST Circuit and Semiconductor Integrated Circuit"

[Patent Document 3] Japanese Patent Publication No. 3193622 "BIST Tester for Multiple Memory Units"

According to the second and third conventional technologies, there are the advantages that the number of SFFs is reduced and the overhead of the areas decreases, that at the shipment test which is carried out to detect a defect in any RAM or bit, a plurality of RAM can be simultaneously tested as shown in FIG. 1B for the first conventional technology, and that the test cost is small. On the other hand, there is the disadvantage that a defect for each bit or a defect for each RAM cannot be discriminated, thereby failing in performing a defect analysis.

As another method of sharing an SFF, there is a sharing method for reducing the number of SFFs using a selector. FIG. 1E shows the configuration of the circuit according to the fourth conventional technology. FIG. 1G shows the configuration of the circuit according to the fifth conventional technology. In FIG. 1E, the output of each RAMs is selected by a selector in a bit unit. The selection result is compared with the expected value output by an expected value generation unit. and the output of the EXOR gate as a comparison result is provided for each SFF.

FIG. 1F is a time chart of a shipment test of the RAM according to the fourth conventional technology shown in FIG. 1E. In the fourth conventional technology, for example, in the four output bits of the RAM 100a, the first and third bits are first selected and tested, and after the test, the second and fourth bits are selected and tested. Therefore, for example, the testing time is double the time according to the first conventional technology shown in FIG. 1B.

In the fifth conventional technology shown in FIG. 1G, an output bit signal is selected, from a plurality of RAM, that is, from the two RAM units (RAMs, for short, hereinafter) in this example, thereby reducing the number of SFFs. FIG. 1H is a time chart of the test at the shipment of RAM in the fifth conventional technology. First, the four bit RAM 100*a* is tested. After the test, the tests of the RAM 100*b* and the RAM 100*c* are simultaneously performed. Like the fourth and fifth conventional technologies, a method using a selector is disclosed by the patent documents 4 and 5.

[Patent Document 4] Japanese Patent Application Publication No. 2003-346498 "BIST Circuit"

[Patent Document 5] Japanese Patent Application Publication No. 2004-144717 "RAM Test Circuit"

In the above-mentioned fourth and fifth conventional technologies, in addition to the number of SFFs, the number of EXOR gates can be reduced. Therefore, there is the merit of reducing the overhead of the areas. However, it is necessary to add a selector. Also at the shipment test on the RAM, all bits of RAM cannot be simultaneously tested in the fourth conventional technology, and a plurality of RAM cannot be simultaneously tested in the fifth conventional technology. Although a defect analysis itself can be performed, but since the output simultaneously observed is limited, it takes a long time to make an analysis. However, a defect analysis is not to test a large number of chips as in the shipment test. Therefore, it does not badly affect the necessary cost.

As described above, there have been the problems with the conventional technologies that the number of SFFs and the overhead of the areas increase in reducing the cost of a defect analysis with all bits of a plurality of RAM in a defect analysis simultaneously observed, that the defect analysis cannot be made or a long testing time of the defect analysis is required or that a long testing time is also required in a shipment test, in reducing the number of SFFs and the overhead of the areas, etc.

SUMMARY OF THE INVENTION

The present invention has been developed to solve the above-mentioned problems, and aims at reducing the test cost as much as possible, realizing a defect analysis, and reducing the area of a memory test circuit, by reducing the number of scan flip-flops fetching the value of a signature as a test result.

The semiconductor storage device according to the present invention includes a plurality of memory units, a plurality of nonmatching detection circuits for each bit, a nonmatching detection signal selection circuit, and a nonmatching result holding circuit. Each nonmatching detection circuit compares bit output of each memory unit with an expected value corresponding to the bit output, and outputs a nonmatching detection signal when the values do not match each other. The nonmatching detection signal selection circuit selects the output of one or more of the nonmatching detection circuits. The selection results from the nonmatching detection signal selection circuit are input to the nonmatching result holding circuit. And when a nonmatching detection signal is output from at least one of the plurality of nonmatching detection circuits for the respective memory units, the nonmatching result holding circuit holds the value of the nonmatching detection signal.

The memory test circuit according to the present invention performs a memory test, and includes a plurality of nonmatching detection circuits for each bit, a nonmatching detection signal selection circuit, and a nonmatching result holding circuit. Each nonmatching detection circuit compares bit output of each memory unit with an expected value corresponding to the bit output, and outputs a nonmatching detection signal when the values do not match each other. The nonmatching detection signal selection circuit selects the output of one or more of the nonmatching detection circuits. When the nonmatching detection signal selection circuit outputs at least one nonmatching detection signal, the nonmatching result holding circuit holes the value of the nonmatching detection signal.

BRIEF DESCRIPTION OF THE DRAWINGS

FIG. 3 shows the configuration of the memory test circuit according to the first embodiment of the present invention;

FIG. 5A is an explanatory view (1) of a defect analysis of the RAM according to the first embodiment of the present invention;

FIG. 5B is an explanatory view (2) of a defect analysis of the RAM according to the first embodiment of the present invention;

FIG. 6 is a time chart of a defect analysis shown in FIGS. 4 and 5;

FIG. 7 shows the configuration of a memory test circuit according to the second embodiment of the present invention;

FIG. 10 is an configuration of the first example of the selection circuit;

FIG. 12 is an explanatory view (2) of the operation according to the first example of the selection circuit;

FIG. 13 is an configuration of the second example of the selection circuit;

FIG. 14 is an explanatory view (1) of the operation according to the second example of the selection circuit;

FIG. 15 is an explanatory view (2) of the operation according to the second example of the selection circuit;

FIG. 16 is an configuration of the third example of the selection circuit;

FIG. 20 is an explanatory view of the comparison result between the memory test circuit according to the present invention and the conventional technology.

DESCRIPTION OF THE PREFERRED EMBODIMENT

The best mode for carrying out the invention is explained below in detail by referring to the attached drawings.

Figure 2:
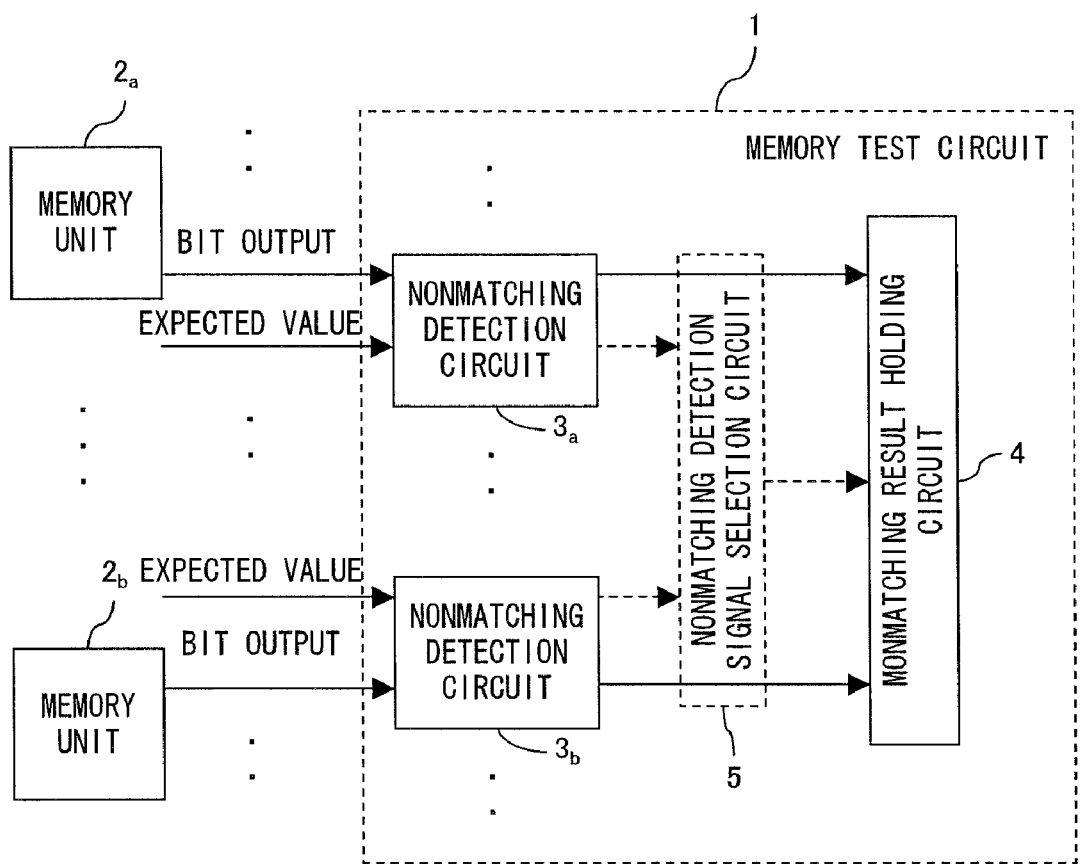
FIG. 2 is a block diagram showing the principle of the memory test circuit according to the present invention.

FIG. 2 is a block diagram showing the principle of the memory test circuit according to the present invention. FIG. 2 shows the principle of the configuration of the teat circuit for performing a test on a plurality of memory units, and corresponds to the first through third embodiments described later.

In FIG. 2, a memory test circuit 1 performs a test on a plurality of memory units 2a, 2b, . . . , and is provided with a plurality of of nonmatching detection circuits 3a, 3b, . . . and a nonmatching result holding circuit 4. It is commonly provided with a plurality of nonmatching result holding circuits 4.

The nonmatching detection circuits 3a, 3b, . . . correspond to, for example, EXOR gates, compare the bit output of each memory unit with the expected value corresponding to the bit output, and outputs a nonmatching detection signal when they do not match each other. Each of the circuit is normally provided for each bit of memory.

The nonmatching result holding circuit 4 is configured by, for example, an OR gate and a scan flip-flop (SFF), and holds the value of a nonmatching detection signal, for example, "1", when at least one of a plurality of nonmatching detection circuits corresponding to different memory units among the plurality of memory units 2a, 2b, that is, the nonmatching detection circuit 3a corresponding to the output of a bit of the memory 2a and the nonmatching detection circuit 3b corresponding to the output of a bit of the memory 2b shown in FIG. 2 outputs a nonmatching detection signal.

In the present invention, the memory test circuit 1 can further comprise a nonmatching detection signal selection circuit 5 shown by the dotted line in FIG. 2. The nonmatching detection signal selection circuit 5 selects one or more pieces of output of the plurality of nonmatching detection circuits 3a, 3b, . . . , and provides the selection results for the nonmatching result holding circuit 4. The nonmatching detection signal selection circuit 5 selects the output of all connected nonmatching detection circuits 3a, 3b, and provides them for the nonmatching result holding circuit 4 at the shipment test of memory, and at the defect analysis of the memory, selects the output of the nonmatching detection circuit corresponding to the memory to be analyzed, for example, the output of 3a corresponding to the memory 2a, from the output of the connected nonmatching detection circuits, and provides the selected output for the nonmatching result holding circuit 4.

The memory test circuit corresponding to the fourth embodiment of the present invention comprises a plurality of nonmatching detection circuits, a nonmatching detection signal selection circuit, and a nonmatching result holding circuit, and is basically a test circuit for performing a test on one memory unit.

The nonmatching detection circuit compares the bit output of memory with the expected value corresponding to the bit output, and outputs a nonmatching detection signal when they do not match each other. Each of the plurality of nonmatching detection circuits is provided for each bit.

The nonmatching detection signal selection circuit selects and outputs at least one of the nonmatching detection signals output by the plurality of nonmatching detection circuits each of which is provided for each bit, and the nonmatching result holding circuit holds the value of the nonmatching detection signal when at least one nonmatching detection signal is output from the selection circuit.

The nonmatching detection circuit in the memory test circuit corresponds to an EXOR gate, the nonmatching result holding circuit corresponds to an OR gate and an SFF, and the nonmatching detection signal selection circuit corresponds to an AND gate and a selection circuit.

As described above, according to the present invention, nonmatching detection signals as comparison results between the bit outputs of a plurality of memory units and expected values are collected and provided for the SFF corresponding to the nonmatching result holding circuit 4, or a nonmatching detection result for each bit of one memory unit is collected and provided for one SFF. Additionally, using the selection circuit and, for example, an AND gate, a nonmatching detection signal corresponding to one or more bits in the bits in one memory unit, or corresponding to one or more of a plurality of memory units is selected and provided for one SFF.

According to the present invention, the value of a signature for each bit between different memory units is collected or the signature between a plurality of bits of one memory unit is collected, thereby possibly reducing the number of scan flip-flops for fetching a test result in a signature analyzer, and largely contributing to the improvement of the area overhead of a memory test circuit.

Furthermore, test results can be segmented among a plurality of memory units, and test results for each bit of one memory unit can be segmented, thereby performing a defect analysis with a test cost reduced, and also contributing the improvement of the memory test efficiency.

FIG. 3 shows the configuration of the memory test circuit according to the first embodiment of the present invention. In the present mode, explanation is given by referring to the random access memory (RAM) as in the explanation of the conventional technology as a memory to be tested, but it is obvious that the memory is not limited to RAM.

In FIG. 3, test targets are a 4-bit RAM 11a, a 2-bit RAM 11b, and a 2-bit RAM 11c. Each of expected value generation units 12a, 12b, and 12c generates an expected value for the output of each RAM, and is connected to a signature analyzer 13 as a memory test circuit together with the three RAMs 11a through 11c.

The signature analyzer 13 is configured by: a selection circuit 15 for outputting a selection signal for selection of the three RAM units 11a through 11c at the defect analysis; four EXOR gates 16 for obtaining an exclusive logical sum for each bit of the respective output of the RAM 11a and the expected value generation unit 12a; two EXOR gates 17 for obtaining an exclusive logical sum of the output of each bit between the RAM 11b and the expected value generation unit 12b; two EXOR gates 18 for obtaining an exclusive logical sum of the output of each bit between the RAM 11c and the expected value generation unit 12c; four AND gates 19 for obtaining a logical product of the output of the four EXOR gates 16 and the selection signal "a" output by the selection circuit 15; two AND gates 20 for obtaining a logical product of the output of the two EXOR gates 17 and the selection signal "c" output by the selection circuit 15; two AND gates 21 for obtaining a logical product of the output of the two EXOR gates 18 and the selection signal "b" output by the selection circuit 15; two OR gates 22 for obtaining a logical sum of the output of the respective AND gates 19 and 20 in two sets of the AND gates 19 and 20; two scan flip-flops (SFF) 23 for fetching and holding each piece of the output of the two OR gates 22; two OR gates 24 for obtaining a logical sum of the output of each AND gate of the two set of the AND gates 19 and 21; and two SFFs 25 for fetching and holding each piece of the output of the two OR gates 24.

The nonmatching detection circuit according to claim 1 of the scope of the claims for the present invention corresponds to the EXOR gates 16, 17, and 18, and the nonmatching result holding circuits correspond to the OR gates 22 and 24, the SFFs 23 and 25, and the nonmatching detection signal selection circuit corresponds to the AND gates 19, 20, 21 and selection circuit 15.

In the first embodiment shown in FIG. 3, the output of the four bits of the RAM 11a in the three RAMs are input to the EXOR gate 16. When the output matches the expected value for each bit output by the expected value generation unit 12a, "0" is output, and when they do not match each other, "1" is output from the respective EXOR gates 16. The output is provided for the AND gate 19, and when the selection signal "a" is "1", the output value is provided for one of the two OR gates 22 or the two OR gates 24, and assigned to one of the two SFFs 23 and 25 through the OR gates. If there is any bit of the four bits output from the RAM 11a not matching the expected value output by the expected value generation unit 12a, then consequently "1" is fetched to one or both of the SFFs 23 and 25.

Similarly, when there is a nonmatching result between the output of each bit of the RAM 11b and the output of each bit of the expected value generation unit 12b, "1" is fetched to one or both of the two SFFs 23. The output of the RAM 11c is compared with the output of the expected value generation unit 12c bit by bit, and if there is a nonmatching result, then "1" is fetched to one or both of the two SFFs 25.

Figure 4:
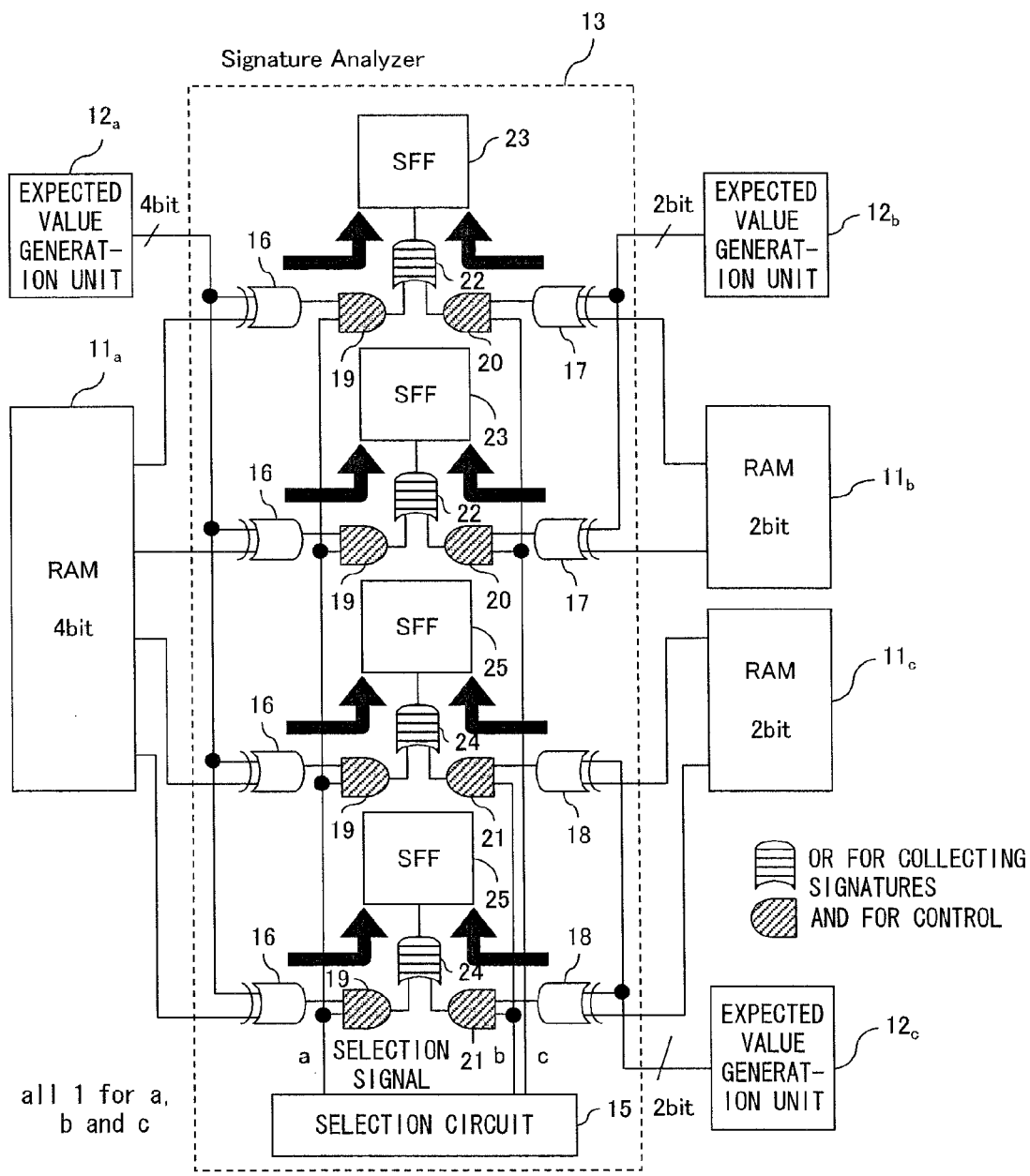
FIG. 4 is an explanatory view of the shipment test of the RAM according to the first embodiment of the present invention.

The operations of the memory test circuit according to the first embodiment shown in FIG. 3 are explained further in detail by referring to FIGS. 4 through 6. FIG. 4 is an explanatory view of the shipment test of the RAM according to the first embodiment of the present invention. At the shipment test, all the selection signals "a, b, and c" output from the selection circuit 15 are assigned "1", and the three RAMs 11a through 11c are simultaneously tested. The output of the EXOR gate corresponding to the output of each bit as a signature of each RAM is fetched and held by one of the two SFFs 23 and 25, through the AND gate 19, 20, or 21, through one of the two OR gates 22 or the two OR gates 24. For example, the signatures as the output of the EXOR gate 16 for the two bits of the four bits output by the RAM 11a and the output of the EXOR gate 17 for the output of the two bits of the RAM 11b are collected by the OR gate 22, and fetched to the SFF 23. In FIG. 4, as shown in FIG. 1B explained by referring to the conventional technology, the three RAM units 11a, 11b, and 11c are simultaneously tested.

FIG. 5A is an explanatory view (1) of a defect analysis of the RAM according to the first embodiment of the present invention. At the shipment test shown in FIG. 4, it is necessary only to determine that any of the three RAMs 11a through 11c is not defective. Therefore, the all values of the selection signal output from the selection circuit 15 is assigned "1" and the shipment test is made. However, only a selection signal corresponding to the RAM to be analyzed at the defect analysis is assigned "1", and all selection signals corresponding to the other RAMs not to be analyzed are assigned "0", thereby performing a test on the RAM to be analyzed.

In FIG. 5A, only the RAM 11a is to be analyzed, and only the selection signal "a" in the signals output by the selection circuit 15 is assigned "1", thereby fetching and holding in the two SFFs 23 and 25 the signature for each bit as the output of the four EXOR gates 16 through the four AND gates 19, and the respective two OR gates 22 and 24. Otherwise, by setting all 4-bit expected values output from the expected value generation unit 12a to "0", the 4-bit output itself of the RAM 11a can be fetched to the two SFFs 23 and 25 by replacing the values of the signatures.

FIG. 5B is an explanatory view (2) of a defect analysis. In FIG. 5B, the two 2-bit RAMs 11b and 11c are to be analyzed, and by assigning "1" to "b" and "c" in the selection signals output by the selection circuit 15, the values of the signatures for the two bits output by the RAM 11b or the output values themselves are fetched to the two SFFs 23, and the values of the signatures for the two bits output by the RAM 11c or the output values themselves are fetched to the two SFFs 25.

FIG. 6 is a time chart of the defect analysis of the RAM corresponding to FIGS. 5A and 5B. In FIG. 6, the RAM 11a is first analyzed, and after the analysis, the RAM units 11b and 11c are simultaneously analyzed.

Figure 1A:
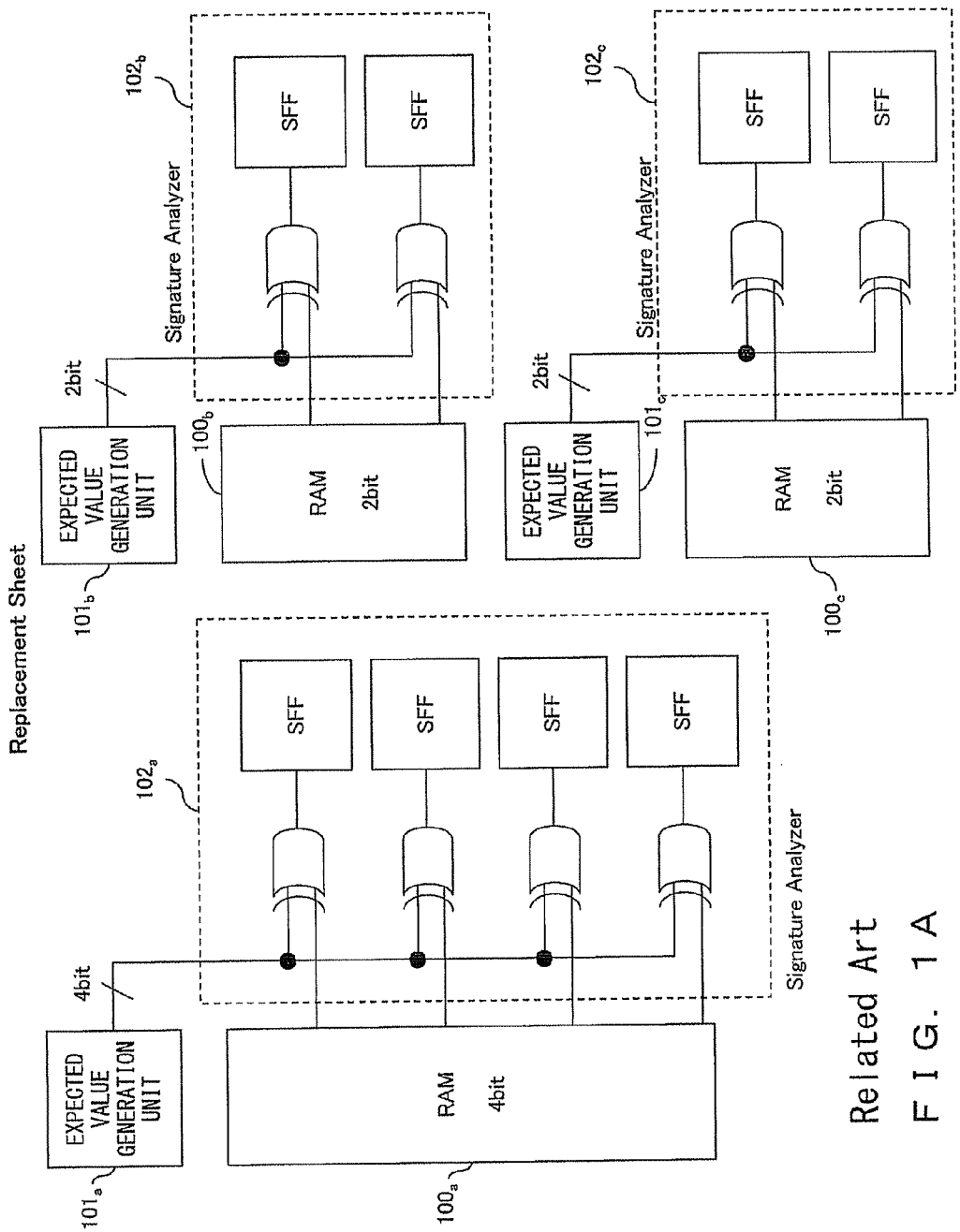
FIG. 1A shows the configuration of the memory test circuit according to the first conventional technology.
Figure 1:
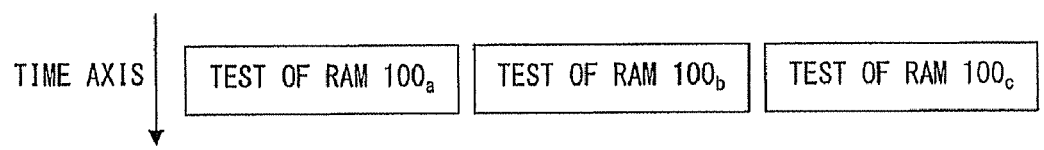
FIG. 1B is a time chart of the shipment test of the RAM shown in FIG. 1A.
FIG. 1C shows the configuration of the memory test circuit according to the second conventional technology.
FIG. 1D shows the configuration of the memory test circuit according to the third conventional technology.
FIG. 1E shows the configuration of the memory test circuit according to the fourth conventional technology.
FIG. 1F is a time chart of the shipment test of the RAM shown in FIG. 1E.
FIG. 1G shows the configuration of the memory test circuit according to the fifth conventional technology.
FIG. 1H is a time chart of the shipment test of the RAM shown in FIG. 1G.

Thus, in the first embodiment, as compared with the first conventional technology explained by referring to FIG. 1A, the number of scan flip-flops (SFF) for fetching the value of a signature is reduced from eight to four. On the other hand, although the selection circuit 15, eight AND gates, and four OR gates are added, the reduction effect is large because the area of the SFF is normally large. The reduction effect is described later. Additionally, a defect analysis can be performed with the number of SFF considerably reduced. Although the number of RAMs to be simultaneously analyzed is limited in the defect analysis, it is not necessary to analyze a large number of chips as in the shipment test, and the influence on the cost such as the testing time, etc. is restrictive. Furthermore, for example, at the shipment test, all RAMs can be simultaneously tested, and the shipment test can be performed at the same cost as the conventional technology shown in FIG. 1A.

Described below are embodiments in which a different memory test circuit is used. FIG. 7 shows the configuration according to the second embodiment. When FIG. 7 is compared with FIG. 3 corresponding to the first embodiment, it is different in that EXNOR circuits 31, 32, and 33 replace the EXOR gates 16, 17, and 18 for obtaining a signature for each bit between the output of each RAM and the output of the expected value generation unit, that all of the AND gates 19, 20, and 21 are changed to OR gates 27, 28, and 29, and that the OR gates 22 and 24 on the input side of each of the SFFs 23 and 25 are respectively changed to AND gates 34 and 35. That is, in the second embodiment, the value of the signature indicating the detection of a nonmatching result for each bit is "0", and when the value "0" is fetched to one or both of the SFFs 23 and 25, the defect of the corresponding RAM is indicated. A selection signal of "0" indicates "selection", and a selection signal of "1" indicates "non-selection".

Figure 8:
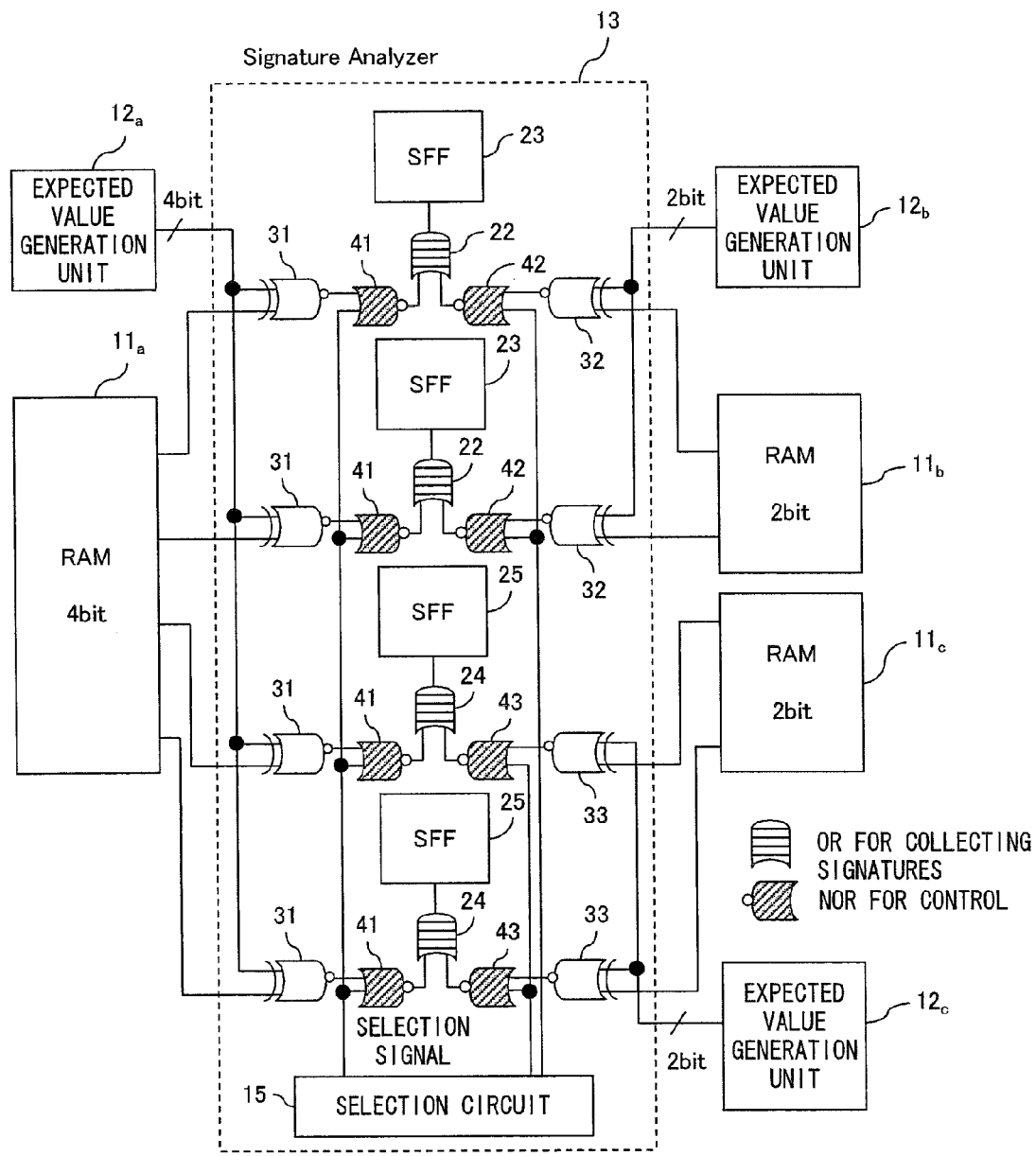
FIG. 8 shows the configuration of a memory test circuit according to the third embodiment of the present invention.

FIG. 8 shows the configuration of the memory test circuit according to the third embodiment of the present invention. When FIG. 8 is compared with FIG. 7 showing the second embodiment, it is different in that NOR gates 41, 42, and 43 replace the OR gates 27, 28, and 29 for receiving the output of each EXNOR gate and a selection signal from the selection circuit 15, and the AND gates 34 and 35 between the output of these NOR gates and the SFFs 23 and 25 are returned to the OR gates 22 and 24 as in the first embodiment shown in FIG. 3.

In the third embodiment, when the value of the selection signal output from the selection circuit 15 is "0", the corresponding RAM is selected, and when it is "1", the corresponding RAM is not selected. Therefore, when the value of the signature output by each of the EXNOR gates 31, 32, and 33 is "0", a nonmatching result with the corresponding bit is detected. And, if the corresponding RAM is selected at this time, the output of the NOR gates 41, 42, and 43 is "1". The output values are collected by the OR gates 22 and 24, and are provided as signals indicating defective RAM for the SFFs 23 and 25 respectively.

Figure 1C:
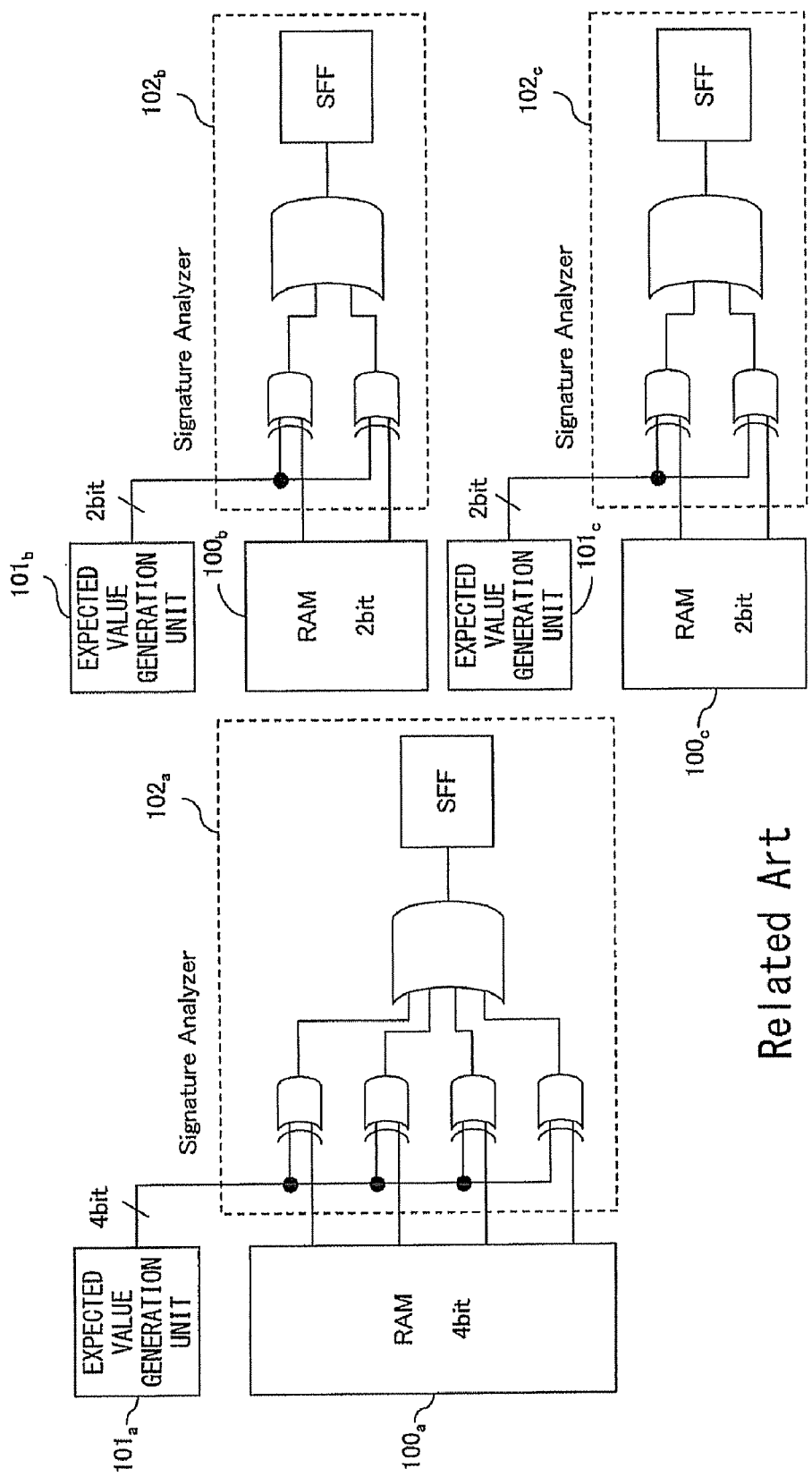
Figure 1D:
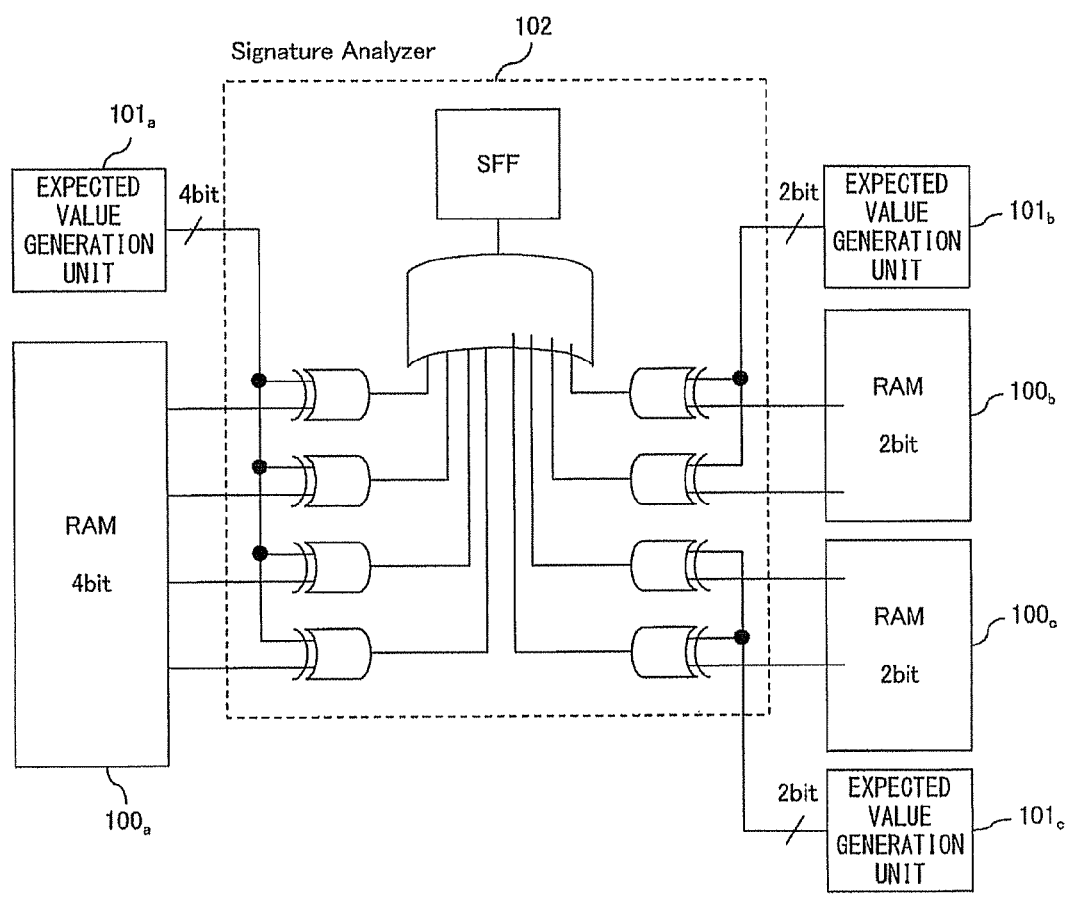
Figure 1E:
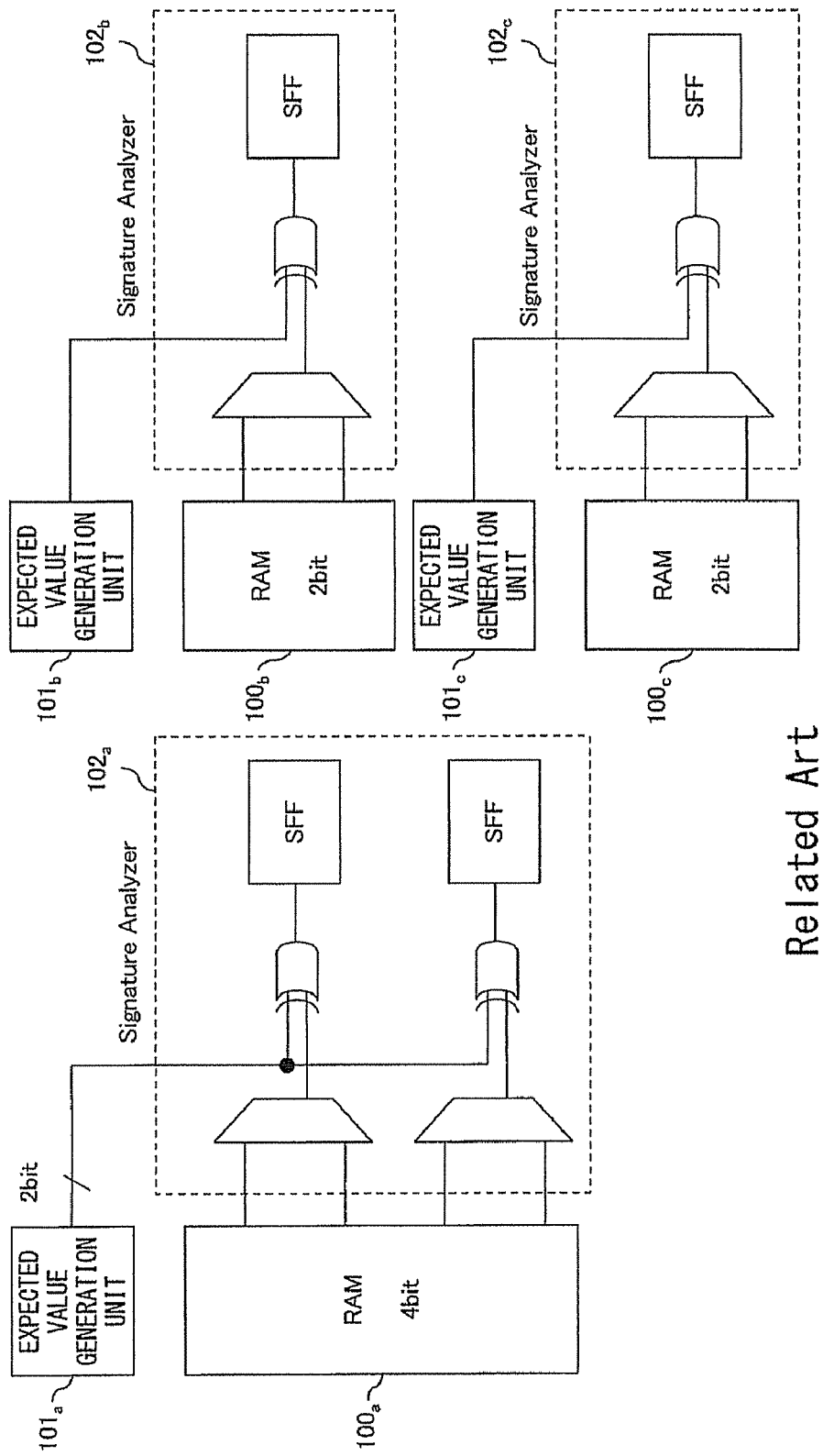
Figure 1F:
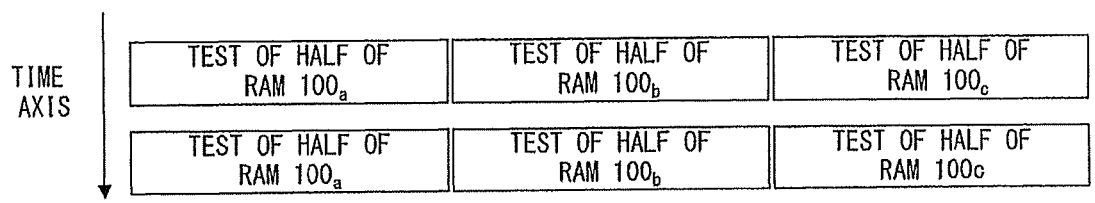
Figure 1G:
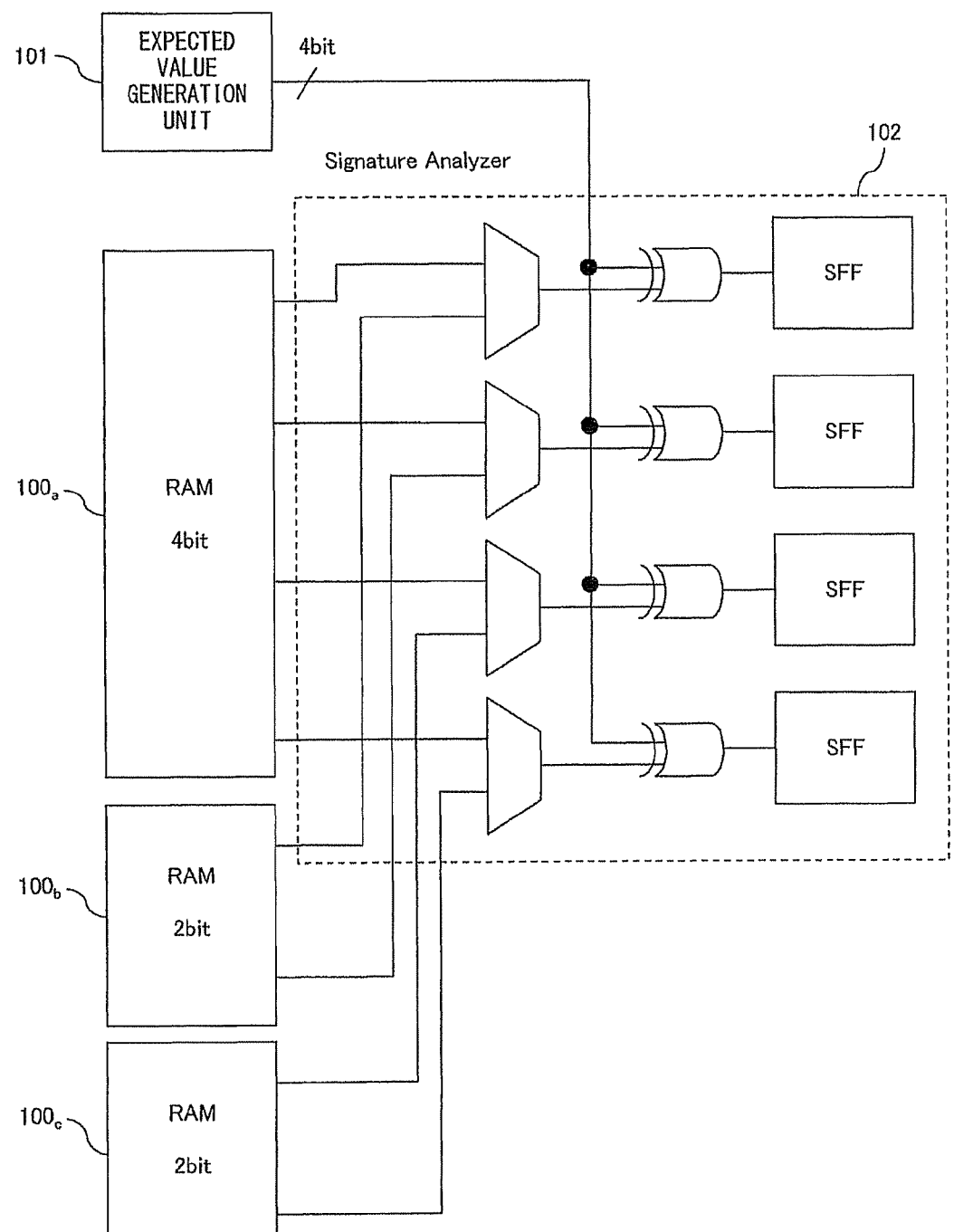
Figure 1:
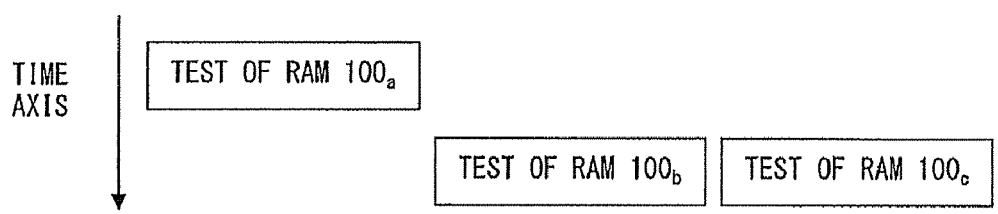
Figure 9:
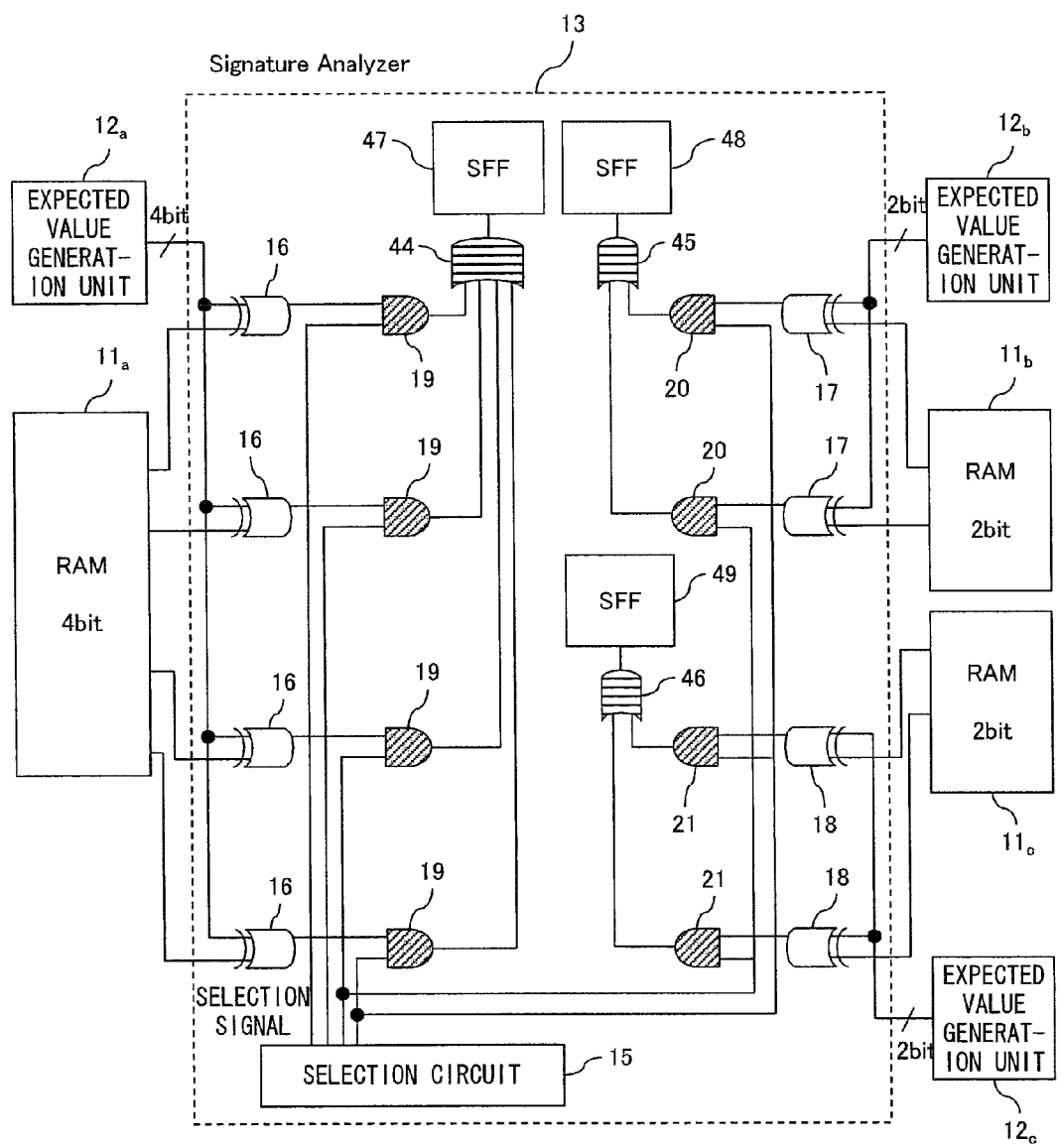
FIG. 9 shows the configuration of a memory test circuit according to the fourth embodiment of the present invention.

FIG. 9 shows the configuration of the memory test circuit according to the fourth embodiment of the present invention. In the fourth embodiment, the values of the signatures for a plurality of bits of the same RAM are collected and are fetched to the respectively corresponding SFFs while in the first through third embodiments, the value of the signature is not collected between bits of one RAM, for example, using an OR gate. In this sense, it is similar to the second conventional technology explained by referring to FIG. 1C, but in this fourth embodiment, the selection circuit 15 for selecting RAM, and the AND gates 19, 20, and 21 are added. However, the selection is not performed in a unit of RAM, but selection in a unit of bit is performed. Therefore, it is different from the second conventional technology in that the defect analysis can be performed in a bit unit. The correspondence between each circuit according to claim 6 and the component shown in FIG. 9 is the correspondence between each circuit according to claim 1 and the component shown in FIG. 2.

The configurations and the operations of the selection circuit according to the above-mentioned embodiments are explained below by referring to FIGS. 10 through 18. FIG. 10 shows the first example of the configuration of the selection circuit. In FIG. 10, the selection circuit 15 is configured by many flip-flops of which number equals to the number of the selection signals, for example, in the first embodiment shown in FIG. 3, three flip-flops (FF) 51, and the selection circuit 15 is provided with a selection signal by a selection signal input terminal 52 and a clock signal by a clock input terminal 53.

In the first example of the configuration shown in FIG. 10, an optional RAM in the optional number of RAMs, or an optional bit of one RAM can be selected. The selection signal input terminal 52 serially provides a selection signal, and data held by the FFs 51 are shifted each time a clock is input, thereby, for example, holding the selection signal of an optional value in the three FFs 51, and performing the above-mentioned shipment test and defect analysis using the selection signal during the test.

Figure 11:
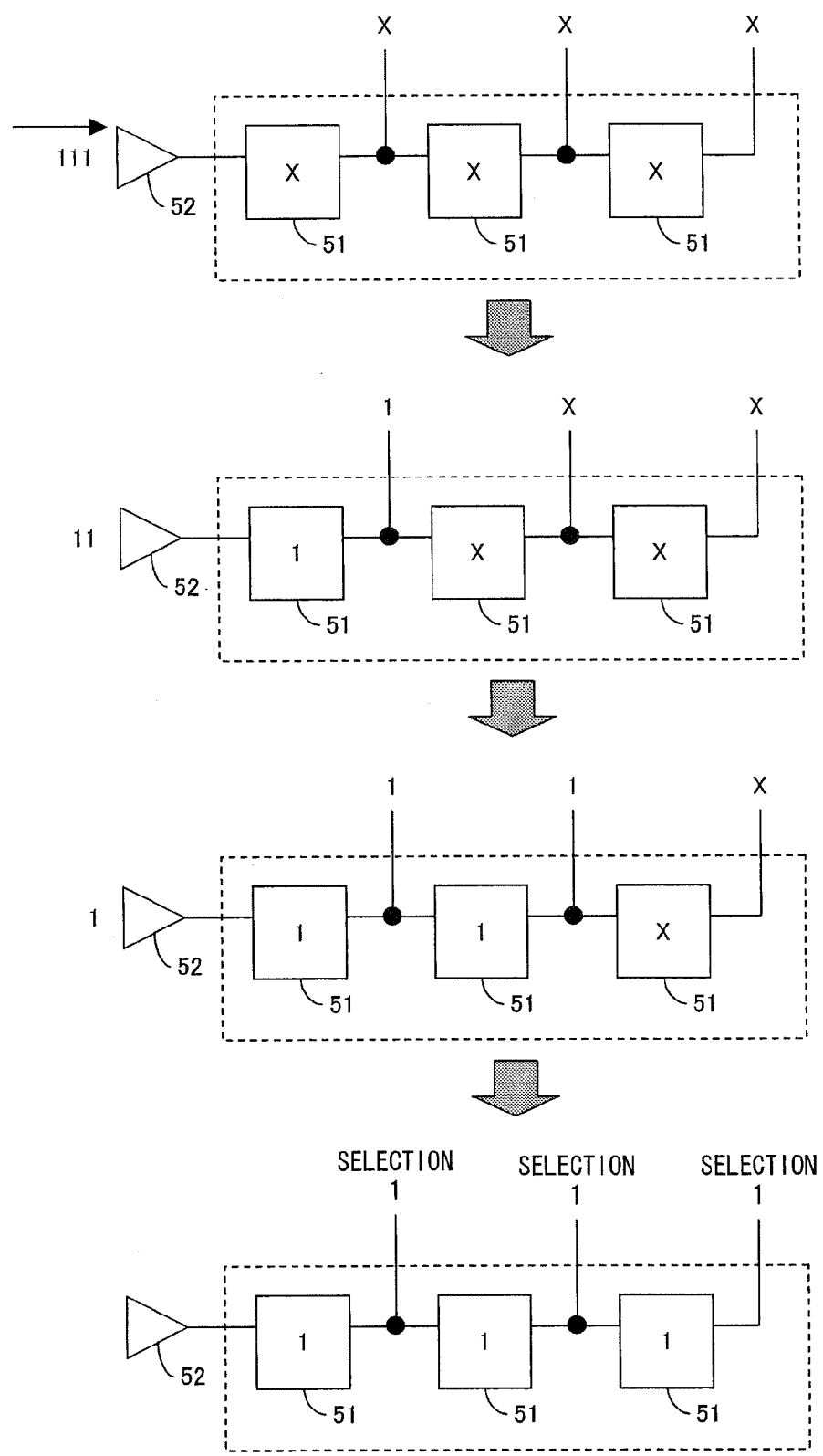
FIG. 11 is an explanatory view (1) of the operation according to the first example of the selection circuit.

FIGS. 11 and 12 are explanatory views of an operation of inputting a selection signal corresponding to the first example of the selection circuit shown in FIG. 10. In FIG. 11, for example, a selection signal "111" for selection of all RAMs as a shipment test is input from the selection signal input terminal 52, and the values are sequentially held in the three FFs 51. In the first time, the data held in the three FFs 51 is X (don't care), but when the first "1" is input, the FF 51 at the first stage holds the value, and when the next "1" is input, the value "1" held in the FF 51 at the first stage is shifted to the FF 51 at the second stage. When the "1" is finally held in the three FFs 51, the input operation of the selection signal terminates.

FIG. 12 is an explanatory view of an input operation when only the value of "b" as a selection signal from the selection circuit 15 is "1", for example, at the defect analysis in FIG. 3. By sequentially inputting data of "010" bit by bit from the selection signal input terminal 52, "0", "1", "0" are respectively held as the values of selection signals finally in the three FFs 51. For example, as with the second embodiment shown in FIG. 7, when the selection signal of "0" indicates "selection", and the selection signal of "1" indicates "non-selection", it is obvious that the selection signal input data is to be inverted.

FIG. 13 shows the configuration of the second example of the selection circuit. In FIG. 13, the selection circuit 15 is configured by four OR gates 55 and four AND gates 56. To one input terminal of the four OR gates 55, a signal from all selection signal input terminals 57 for selection of all RAMs at, for example, a shipment test is supplied. When all RAMs are selected, the signal indicates "1", and when individual RAM is selected, the signal indicates "0".

For the four AND gates 56, 2-bit selection code is provided by selection code signal input terminals 58 and 59. In the four AND gates 56, two input terminals of one AND gate are negative logics, and the one input terminal of two AND gates is negative logics. For example, only the value of a selection signal output from the leftmost OR gate 55 becomes "1", when "11" is assigned as a 2-bit selection code signal to the selection code signal input terminals 58 and 59. To set the selection signal from the second leftmost OR gate 55 to "1", "00" is assigned as a 2-bit selection code signal to the selection code signal input terminals 58 and 59.

FIGS. 14 and 15 are explanatory views showing the operation of outputting a selection signal in the second example of the selection circuit. In FIG. 14, for example, to select all RAMs in the shipment test, "1" is input from all selection signal input terminals 57, and the all values of selection signals are "1". At this time, the value of the input signal to the selection code signal input terminals 58 and 59 is "don't care".

FIG. 15 is an explanatory view of the operation in the second example of the selection circuit to select only one RAM or a bit. By assigning "0" to all selection signal input terminal 57, "0" to the input terminal 58 and "1" to the input terminal 59 in the selection code signal input terminals, the output of the second rightmost AND gate 56 is "1", and "1" is output as the selection signal from the second rightmost OR gate 55.

Figure 17:
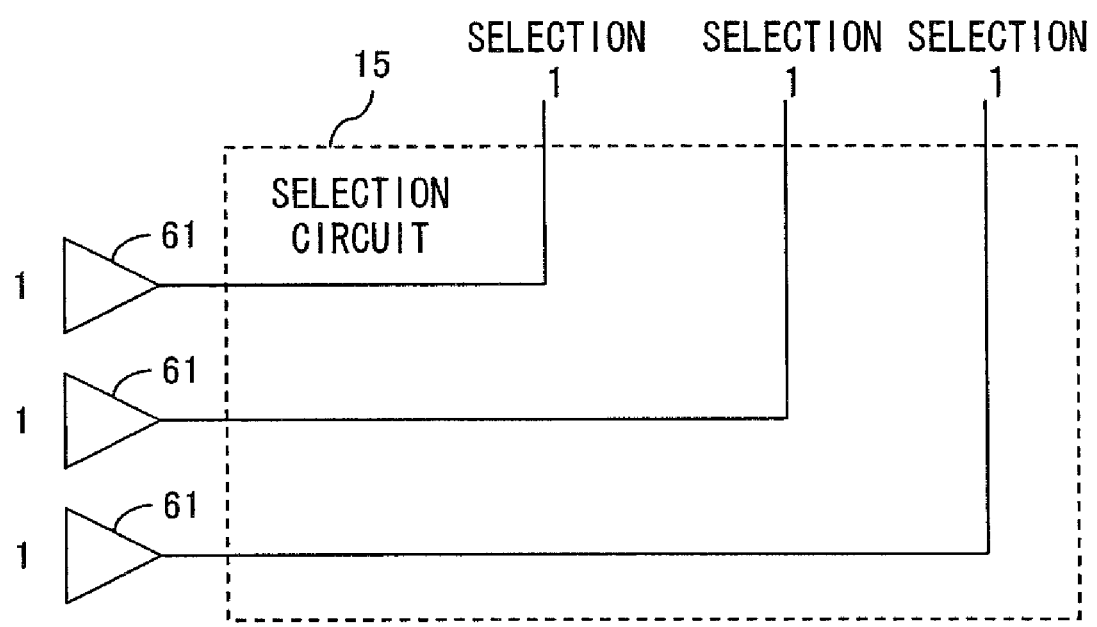
FIG. 17 is an explanatory view (1) of the operation according to the third example of the selection circuit.
Figure 18:
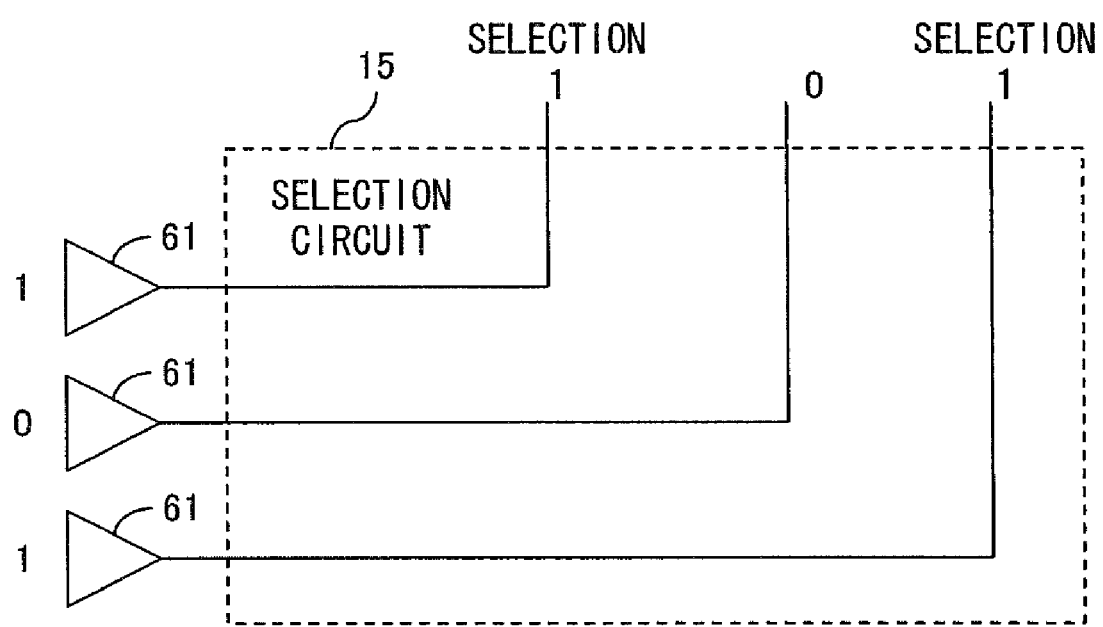
FIG. 18 is an explanatory view (2) of the operation according to the third example of the selection circuit.

FIG. 16 is an configuration of the third example of the selection circuit. In FIG. 16, the selection circuit 15 provides a selection signal from an external terminal directly to, for example, the AND gates 19, 20, and 21 shown in FIG. 3, and outputs the selection signal provided from selection signal input terminals 61 of the number corresponding to the number of bits, or the number of RAMs to be selected. FIGS. 17 and 18 are explanatory views showing the operations of the third example of the selection circuit. In FIG. 17, to set the values of three selection signals to all "1", "1" is input from the three selection signal input terminals 61. In FIG. 18, to set the values of two selection signals to "1", "1" is input to two of the three selection signal input terminals 61, and "0" is input to the remaining selection signal input terminal 61.

Figure 19:
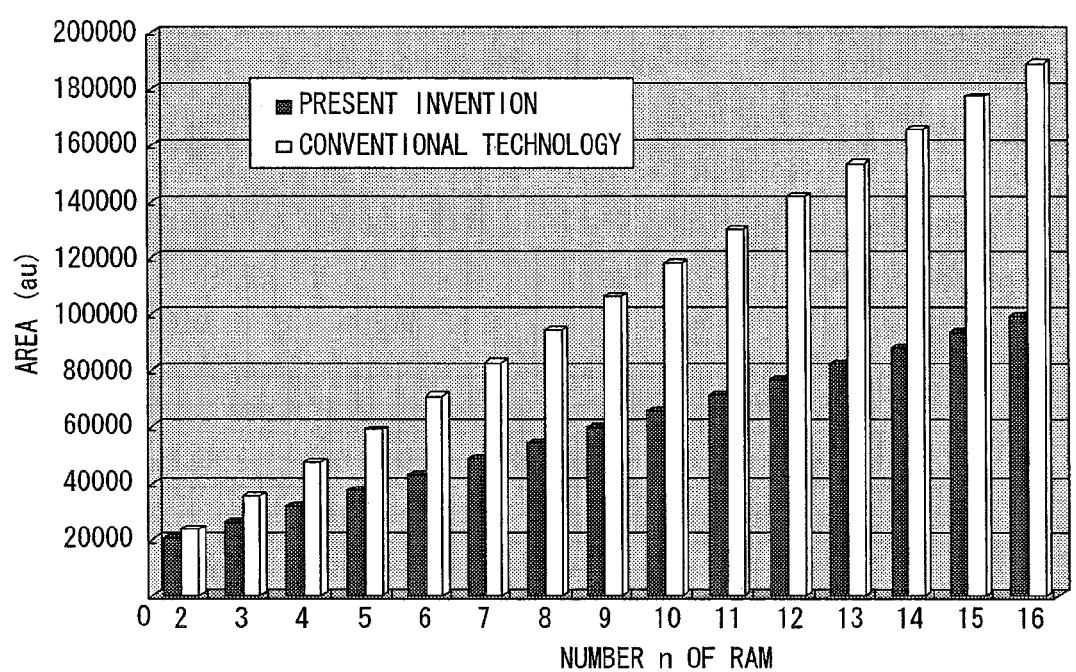
FIG. 19 shows the area reduction effect of a memory test circuit.

Thus, the embodiments of the memory test circuit according to the present invention are explained above in detail. Described below by referring to FIG. 19 is the area reduction effect of the test circuit according to the present invention. In this example, FIG. 3 showing the first embodiment according to the present invention is compared with FIG. 1A showing the first conventional technology with reference to the areas. It is assumed that the comparison is made by excluding the circuit area such as the bodies of the RAM, the expected value generation unit, the EXOR gate for obtaining an exclusive logical sum, etc. which are common to those to be compared.

The circuit area when there are n RAMs in FIG. 21 is calculated by the area of an SFF×total number of bits of each RAM In FIG. 2 showing the present invention, it is calculated by (area of SFF+area of n input OR gates)×(number of bits of RAM having largest number of bits in plural RAMs)+(area of 2 input AND gate)×(total number of bits of each RAM)+area of selection circuit.

FIG. 19 shows the area reduction effect when the numbers of bits of n RAMs are all 64, and the selection circuit is an example of the configuration shown in FIG. 10. The area calculation is performed using a typical cell size. With an increasing number n of RAMs, the area reduction effect of the memory test circuit according to the present invention is enhanced.

FIG. 20 shows the comparison result about the memory test circuit between the present invention and the conventional technology. As compared with the five conventional technologies, the memory test circuit according to the present invention excels the conventional technologies in area overhead, test cost, and possibility of defect analysis, etc.

In the descriptions above, for example, in the first embodiment shown in FIG. 3, the signatures of two RAMs are collectively input to one scan flip-flop, but it is also possible to collectively input the signatures of three or more RAMs using an OR gate.

What is claimed is:

1. A semiconductor storage device, comprising:
a plurality of memories comprising one memory having a large number of bits and at least two or more memories having a small number of bits, where the total number of bits of the at least two or more memories having a smaller number of bits is smaller than the number of bits of the one memory having a large number of bits;
a plurality of nonmatching detection circuits, each of which is provided for every single bit of the one memory having the large number of bits and the two or more memories having the small number of bits, compares bit output of each of the plurality of memories with an expected value corresponding to the bit output, and each of which outputs a nonmatching detection signal when the bit output and the expected value do not match each other;
a selection circuit selecting and holding either a nonmatching detection signal that corresponds to a bit belonging to the first group of the bits of the one memory having the large number of bits or a nonmatching detection signal that corresponds to a bit of a memory out of the two or more memories having the small number of bits;
the selection circuit selecting and holding separately a nonmatching detection signal that corresponds to a bit belonging to a second group different from the first group of the bits of the memory having the large number of bits or a nonmatching detection signal that corresponds to a bit of another memory out of the two or more memories having the small number of bits; and
a plurality of nonmatching result holding circuits adapted to store a plurality of bit outputs from different memories, each of the nonmatching result holding circuits holding the nonmatching detection signal output from a corresponding one of the nonmatching detection circuits selected by the selection circuit.

2. The device according to claim 1, wherein
the selection circuit selects all output of the plurality of nonmatching detection circuits connected to the selection circuit, and provides the output for the nonmatching result holding circuit.

3. The device according to claim 1, wherein
the selection circuit selects output of a nonmatching detection circuit corresponding to a memory to be analyzed from among the plurality of memories in the plurality of nonmatching detection circuits connected to the selection circuit, and provides the output for the nonmatching result holding circuit.

4. The device according to claim 1, wherein
a number of nonmatching result holding circuits is equal to a number of bits of a memory of the plurality of memories having a largest number of bits.

5. The device according to claim 1, wherein
at least one of the plurality of memories is a random access memory.

6. A memory test circuit which performs a test of memory, comprising:
a plurality of nonmatching detection circuits, each of which is provided for every single bit of the one memory having the large number of bits and the two or more memories having the small number of bits, compares bit output of each of the plurality of memories with an expected value corresponding to the bit output, and each of which outputs a nonmatching detection signal when the bit output and the expected value do not match each other;
a selection circuit selecting and holding either a nonmatching detection signal that corresponds to a bit belonging to the first group of the bits of the one memory having the large number of bits or a nonmatching detection signal that corresponds to a bit of a memory out of the two or more memories having the small number of bits;
the selection circuit selecting and holding separately a nonmatching detection signal that corresponds to a bit belonging to a second group different from the first group of the bits of the memory having the large number of bits or a nonmatching detection signal that corresponds to a bit of another memory out of the two or more memories having the small number of bits; and
a plurality of nonmatching result holding circuits adapted to store a plurality of bit outputs from different memories, each of the nonmatching result holding circuits holding the nonmatching detection signal output from a corresponding one of the nonmatching detection circuits selected by the selection circuit.

7. The circuit according to claim 6, wherein
when a shipment test is performed on the memory, the selection circuit selects all output of the plurality of nonmatching detection circuits connected to the selection circuit, and provides the output for the nonmatching result holding circuit.

8. The circuit according to claim 6, wherein
when a memory defect analysis is performed, the selection circuit selects output of a nonmatching detection circuit corresponding to a bit to be analyzed in the plurality of nonmatching detection circuits connected to the selection circuit, and provides the output for the nonmatching result holding circuit.

9. The circuit according to claim 6, wherein
the memory is a random access memory.

10. The circuit according to claim 6, wherein
a shipment test or a defect analysis test can be selectively performed on a memory.

* * * * *